United States Patent [19]

Tsuchiya

[11] Patent Number: 6,041,006
[45] Date of Patent: Mar. 21, 2000

[54] SEMICONDUCTOR MEMORY DEVICE

[75] Inventor: Tomohiro Tsuchiya, Tokyo, Japan

[73] Assignee: NEC Corporation, Tokyo, Japan

[21] Appl. No.: 09/261,701

[22] Filed: Mar. 3, 1999

[30] Foreign Application Priority Data

Mar. 4, 1998 [JP] Japan .................................. 10-051933
[51] Int. Cl.$^7$ .................................................. G11C 13/00
[52] U.S. Cl. ...................................... 365/210; 365/230.03
[58] Field of Search ............................ 365/210, 189.01, 365/200, 230.01, 230.03

[56] References Cited

U.S. PATENT DOCUMENTS 5,691,946 11/1997 DeBrosse et al. ....................... 365/200

FOREIGN PATENT DOCUMENTS

| 0 433 141 A1 | 6/1991 | European Pat. Off. . |
| 0 434 200 A1 | 6/1991 | European Pat. Off. . |
| 7-122096 | 5/1995 | Japan . |
| 8-335399 | 12/1996 | Japan . |

*Primary Examiner*—Terrell W. Fears
*Attorney, Agent, or Firm*—Darryl G. Walker

[57] ABSTRACT

A semiconductor device is disclosed that includes blocks (101–104) having normal cell arrays and redundant cell arrays. An R/N switchover setting circuit (140) includes, in one embodiment, a plurality of normally conducting transistors arranged in series. A redundancy determination circuit (120) receives an address and determines whether or not a redundancy cell array is to be used. When a redundancy cell array is to be used, the redundancy determination circuit (120) outputs not only an active YPR signal, but also the current column-wise position of the defective cell array. The position information is applied to the switchover setting circuit (140) through a redundancy position decoder (130). The switchover setting circuit (140) generates switching signals DSW based on the received column positions, and outputs the signals to the R/N switching circuit (150). The switching circuit (150) switches and connects, on the basis of the received signals, the I/O lines of an input/output section to selected normal cell arrays and a redundant cell array, bypassing the defective cell array.

21 Claims, 10 Drawing Sheets

| POSITION OF DEFECTIVE CELL ARRAY | REDUNDANCY POSITION SIGNAL | | | | | RED. SEL. SIGNAL | POSITION SIGAL THAT IS SET TO "1" |
|---|---|---|---|---|---|---|---|
| | IORED1 | IORED2 | IORED4 | IORED8 | IORED16 | YPR | |
| 0 | 0 | 0 | 0 | 0 | 0 | 1 | IOSEL0 |
| 1 | 1 | 0 | 0 | 0 | 0 | 1 | IOSEL1 |
| 2 | 0 | 1 | 0 | 0 | 0 | 1 | IOSEL2 |
| 3 | 1 | 1 | 0 | 0 | 0 | 1 | IOSEL3 |
| 4 | 0 | 0 | 1 | 0 | 0 | 1 | IOSEL4 |
| 5 | 1 | 0 | 1 | 0 | 0 | 1 | IOSEL5 |
| 6 | 0 | 1 | 1 | 0 | 0 | 1 | IOSEL6 |
| 7 | 1 | 1 | 1 | 0 | 0 | 1 | IOSEL7 |
| 8 | 0 | 0 | 0 | 1 | 0 | 1 | IOSEL8 |
| 9 | 1 | 0 | 0 | 1 | 0 | 1 | IOSEL9 |
| 10 | 0 | 1 | 0 | 1 | 0 | 1 | IOSEL10 |
| 11 | 1 | 1 | 0 | 1 | 0 | 1 | IOSEL11 |
| 12 | 0 | 0 | 1 | 1 | 0 | 1 | IOSEL12 |
| 13 | 1 | 0 | 1 | 1 | 0 | 1 | IOSEL13 |
| 14 | 0 | 1 | 1 | 1 | 0 | 1 | IOSEL14 |
| 15 | 1 | 1 | 1 | 1 | 0 | 1 | IOSEL15 |
| 16 | 0 | 0 | 0 | 0 | 1 | 1 | IOSEL16 |
| 17 | 1 | 0 | 0 | 0 | 1 | 1 | IOSEL17 |
| 18 | 0 | 1 | 0 | 0 | 1 | 1 | IOSEL18 |
| 19 | 1 | 1 | 0 | 0 | 1 | 1 | IOSEL19 |
| 20 | 0 | 0 | 1 | 0 | 1 | 1 | IOSEL20 |
| 21 | 1 | 0 | 1 | 0 | 1 | 1 | IOSEL21 |
| 22 | 0 | 1 | 1 | 0 | 1 | 1 | IOSEL22 |
| 23 | 1 | 1 | 1 | 0 | 1 | 1 | IOSEL23 |
| 24 | 0 | 0 | 0 | 1 | 1 | 1 | IOSEL24 |
| 25 | 1 | 0 | 0 | 1 | 1 | 1 | IOSEL25 |
| 26 | 0 | 1 | 0 | 1 | 1 | 1 | IOSEL26 |
| 27 | 1 | 1 | 0 | 1 | 1 | 1 | IOSEL27 |
| 28 | 0 | 0 | 1 | 1 | 1 | 1 | IOSEL28 |
| 29 | 1 | 0 | 1 | 1 | 1 | 1 | IOSEL29 |
| 30 | 0 | 1 | 1 | 1 | 1 | 1 | IOSEL30 |
| 31 | 1 | 1 | 1 | 1 | 1 | 1 | IOSEL31 |
| None | 0 | 0 | 0 | 0 | 0 | 0 | NONE |

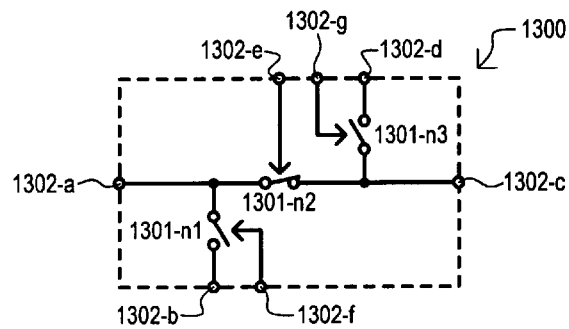
FIG. 13
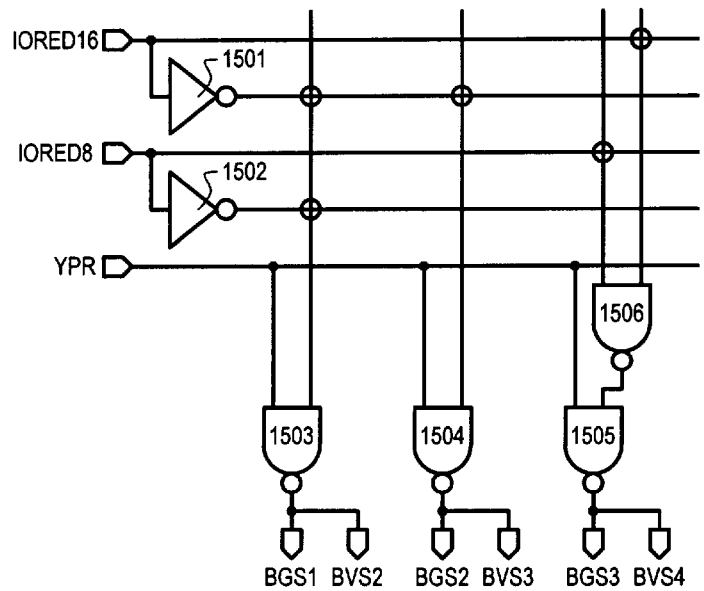
FIG. 15a
| POSITION OF DEFECTIVE CELL | INPUT | | OUTPUT | | | | | |
|---|---|---|---|---|---|---|---|---|
| | REDUNDANCY POSITION SIGNAL | | V-SETTING SIGNAL | | | G-SETTING SIGNAL | | |
| | IORED16 | IORED8 | BVS4 | BVS3 | BVS2 | BGS3 | BGS2 | BGS1 |
| 0 ~ 7 | 0 | 0 | 0 | 0 | 0 | 0 | 0 | 0 |
| 8 ~ 15 | 0 | 1 | 0 | 0 | 1 | 0 | 0 | 1 |
| 16 ~ 23 | 1 | 0 | 0 | 1 | 1 | 0 | 1 | 1 |
| 24 ~ 31 | 1 | 1 | 1 | 1 | 1 | 1 | 1 | 1 |
| YPR=0 | — | — | 1 | 1 | 1 | 1 | 1 | 1 |
FIG. 15b

SEMICONDUCTOR MEMORY DEVICE

TECHNICAL FIELD

The present invention relates to semiconductor memory devices having redundancy memory cells, and more specifically, to a semiconductor memory device having a column redundancy selection circuit for selecting column redundancy memory cells.

BACKGROUND OF THE INVENTION

Semiconductor memory devices (hereinafter referred to as "memories") typically store information in memory cells. The capacity (number of memory cells) of memories increases year by year, resulting in memories having many millions of cells. Such large capacity memories has made it difficult to produce a single memory that is completely free from defective memory cells. To overcome this problem, redundancy memory cells are provided so that defective memory cells can be replaced. In this way, when memories are produced in large numbers, the number of functional devices within a production group is increased ("yield" is improved).

Within a memory device, memory cells are usually arranged into an array having rows and columns. Memory cells can then be activated on a row basis by word lines, and then accessed by the bit lines. One major technique for replacing defective memory cells is to provide one or more additional rows of memory cells that function as redundancy cells. In this arrangement, when a row has a defective memory cell, instead of activating the word line coupled to the defective cell, the word line coupled to a redundant cell will be activated. As a result, a row of redundancy memory cells is accessed instead of the row having the defective memory cell.

A memory is typically accessed by way of one or more input/outputs (I/Os). For example, memory cells within a "volatile" type memory can be read from or written to by way of I/Os, and memory cells within "non-volatile" type memory can be programmed, read from, and sometimes erased by way of I/Os. In the past it has been common to design memories with 4 to 16 I/Os. In recent years this number has increased up to 32 to 64. In addition, some memory-incorporated gate arrays and "systems-on-chip" can have as many as 256 I/Os.

Such an increase in the number of I/Os has also increased the percentage of defective cells in the column direction. In the column direction, there are many column-specific circuits, such as memory cells, a column selection circuit, sense amplifiers and data amplifiers. Accordingly, conventional redundancy circuit approaches that provide redundant memory cells in the row direction do not adequately address defects encountered in the column direction.

FIG. 17, which presents a first conventional device, is a diagram showing a configuration of a main portion of a memory circuit disclosed in Japanese Patent Application, JP-A-8-335399 filed on Jun. 7, 1995, and laid open to the public on Dec. 12, 1996.

The memory circuit of FIG. 17 is configured so that memory cell arrays M11 to M35 are connected to word lines WL1 to WL3 and bit lines BL1 to BL5. Each bit line (BL1 to BL5) is connected to a plurality of outside bit lines OBL1 to OBL4 through row selection circuits (selectors) SEL1 to SEL4.

The selectors SEL1 to SEL4 control the way in which bit lines BL1 to BL5 are connected to outside bit lines OBL1 to OBL4. In particular, the selectors (SEL1 to SEL4) are configured to prevent any bit line having defective cells from being connected to an outside bit line (OBL1–OBL4). In this way, defective cells in a column direction can be bypassed.

The switching operation of the selectors (SEL1–SEL4) is controlled by control memory cells C11 to C14. Each control memory cell (C11 to C14) stores switching information for a particular selector (SEL1–SEL4). The use of control memory cells can be more cost effective than other approaches. For example, other conventional column redundancy approaches may use fusible links (fuses) to disable (or otherwise avoid) a column of defective cells and enable a column of redundancy cells. The fuses are usually programmed for such a replacement operation by opening (or "blowing") selected fuses with a laser. This can be a time consuming operation, require expensive equipment, and consume additional device area, as fuses are typically relatively large structures.

Accordingly, by employing such control memory cells, expensive laser devices for disconnecting fuses can be dispensed with. However, the above configuration requires that the switching information be stored in the control memory cells C11 to C14 on a bit-by-bit fashion via a single data line. Such an approach can be problematic in that it can require considerable time to complete the initial setting of the switching information values.

Another conventional approach involves utilizing a shift register in place of the control memory cells of the first conventional device. A shift register is a circuit having a series of storage units. Data bits can be shifted from one storage unit to the next, until all the storage units store data. Switching information can then be set in synchronism with a clock, with data shifting to the next storage unit on a given clock cycle. However, this technique also imposes the problem that the time required to set the values increases in proportion to increases in the number of I/Os.

To shorten such switching time, a second conventional device shown in FIG. 18 is disclosed in Japanese Patent Application JP-A-7-122096. FIG. 18 is a diagram showing a configuration of a main portion of a semiconductor memory having a redundancy cell array.

In FIG. 18, the semiconductor memory has many memory cell arrays NS0 to NS5, and so on. Each array has a corresponding I/O node 1/O0 to 1/O4, and so on. Each group of I/O lines I/O0 to I/O4 is connected to a corresponding group of switches SW0 to SW4. Each switch connects an I/O line to only one I/O node selected in response to a supplied control signal.

In the second conventional device, it is assumed that array NS3 is defective, and so must be bypassed. As shown in FIG. 18, all the switches on the left side of a defective array NS3, as viewed in FIG. 18, are set to be connected to arrays on the left side of their I/O connection sections. At the same time, all the switches on the right side of the defective array NS3 are set to be connected to arrays on the right side of their I/O connection sections.

Fuses can be used to set the switching directions for the arrangement of FIG. 18. The number of fuses is equal to the number of I/O lines plus one, and are connected in series with one another. One end of each fuse is connected to the power supply and the other to the ground. Further, nodes between the fuses are connected to the switches, providing switch control signals, respectively. By disconnecting a fuse during inspection, the nodes toward the power supply with respect to the disconnected fuse are set to "1," and the nodes toward the ground to "0" so that the switching directions of the switches can be set in such a fixed manner. With this operation, switching speed can be improved by avoiding delays introduced by the propagation of control signals used for replacing a defective cell array with a redundancy cell array.

The first conventional device shown in FIG. 17 determines the switching directions by giving the switching information to the control memory cells. A drawback to such an approach is that an increase in the number of outside bit lines increases the amount of time required to set the switching information in the control memory cells.

The second conventional device shown in FIG. 18, a defective cell array is avoided by employing a number of switches, and setting the switching direction of the switches to prevent a defective memory cell from being coupled to an I/O node. A drawback to the second conventional device is that the switching direction is established by fuses. Consequently, an increase in the number of input/outputs increases the number of fuses that must be employed. Since the fuses must be physically disconnected using laser devices or the like, the fuse circuits cannot be reduced in size the same manner as other circuit devices (such as transistors). Hence, additional fuses can result in additional device ("chip") area. In addition, a larger-scale memory requires a larger number of memory cells to be connected to a single bit line, and this increases the incidence of defective cell arrays. The specification describing the second conventional device discloses no solution to addressing the problem arising when a plurality of defective arrays are present.

SUMMARY OF THE INVENTION

An object of the present invention is to provide high-speed and dynamic switching from a cell array having defective cells to a redundancy cell array.

It is another object of the present invention to provide high-speed and dynamic switching from a cell array having defective cells to a redundancy cell array without increasing the size of the resulting circuit. To solve the aforementioned problems, the present invention provides a semiconductor memory device comprising: a plurality of normal cell arrays, each including a plurality of memory cells; a redundancy cell array including a plurality of memory cells, a plurality of memory blocks, each including a plurality of normal cell arrays and at least one redundancy cell array; redundancy determination means for storing redundancy selection information and defective position information, the redundancy selection information indicating whether or not replacement with a redundancy cell array is made for each memory block, the defective position information indicating a position of a normal cell array that is to be replaced with the redundancy cell array; a setting circuit having first and second terminals and being capable of setting the first and second terminals to a conducting state and a non-conducting state based on the defective position information using a first switch; R/N switchover setting means for connecting the first terminal of a setting circuit to the second terminal of an adjacent setting circuit, connecting a highest terminal to a redundancy selection information output terminal, connecting a lowest terminal to a second logic level, and outputting a bit line switching signal from the second terminal; and an R/N switching circuit for selecting one of two bit lines based on the bit line switching signal output of the R/N switchover setting means and connecting the selected bit line to an input/output section.

Further, the setting circuit has a third terminal for receiving a signal based on the redundancy position information, and second switching means having one end thereof connected to a first logic level, other end thereof to the second terminal, and a control terminal thereof to the third terminal, the second switching means being set to a non-conducting state when first switching means is in a conducting state and to the conducting state when the first switching means is in the non-conducting state.

Further, the setting circuit has third switching means having one end thereof connected to the second logic level, other end thereof to the first terminal, and a control terminal thereof to the third terminal, the third switching means being set to the non-conducting state when the first switching means is in the conducting state and to the conducting state when the first switching means is in the non-conducting state.

Further, the R/N switchover setting means comprises a setting control circuit for outputting a V-setting signal that sets a terminal of each block to a first logic level based on the redundancy position information; and the setting circuit has a third terminal for receiving a defective position signal based on the redundancy position information and a fourth terminal for receiving the V-setting signal, and second switching means having one end thereof connected to the first logic level, other end thereof to the second terminal, and a control terminal thereof to the fourth terminal.

Further, the R/N switchover setting means comprises a setting circuit divided into a plurality of blocks and a setting control circuit for outputting a G-setting signal that sets a terminal of each block to the second logic level based on the redundancy position information; and the setting circuit has a third terminal for receiving a defective position signal based on the redundancy position information and a fifth terminal for receiving the G-setting signal, and third switching means having one end thereof connected to the second logic level, other end thereof to the first terminal, and a control terminal thereof to the fifth terminal.

Further, the redundancy determination means comprises a plurality of fuse blocks and a block selection circuit, each fuse block storing the defective position information of a normal cell array to be replaced with a redundancy cell array by converting the information into a binary code, the block selection circuit outputting a signal for selecting a fuse block.

Further, the block selection circuit comprises an address decoder for decoding an address and outputting the signal for selecting a fuse block.

Further, the block selection circuit is a circuit for outputting a signal for selecting a fuse block and a memory block based on a bank selection signal.

Further, the fuse block comprises a first fuse circuit for storing the redundancy selection information and a plurality of second fuse circuits for storing the defective position information; and each of the second fuse circuits is connected to a first logic level via the first fuse circuit.

Further, the fuse block comprises first and second fuses for storing the redundancy selection information, and third and fourth fuses for storing the defective position information; and one end of the first fuses is connected to a first logic level, other end thereof not only to one end of each of the second and third fuses but also to a redundancy selection signal output terminal. The other end of the second fuses is connected to a second logic level, while the other end of the third fuse is connected not only to one end of the fourth fuses but also to a redundancy position signal output terminal. The other end of the fourth fuse is connected to the second logic level.

Further, the R/N switching means is commonly connected to bit lines of the plurality of memory blocks.

BRIEF DESCRIPTION OF THE DRAWINGS

FIG. 13 is a diagram showing a configuration of a setting circuit according to the third embodiment.

FIG. 15a is a circuit diagram of a setting control circuit. FIG. 15b is a truth table for a setting control circuit.

DETAILED DESCRIPTION OF THE EMBODIMENTS

The present invention will now be described in a series of particular embodiments and with reference to a number of drawings.

Figure 1:
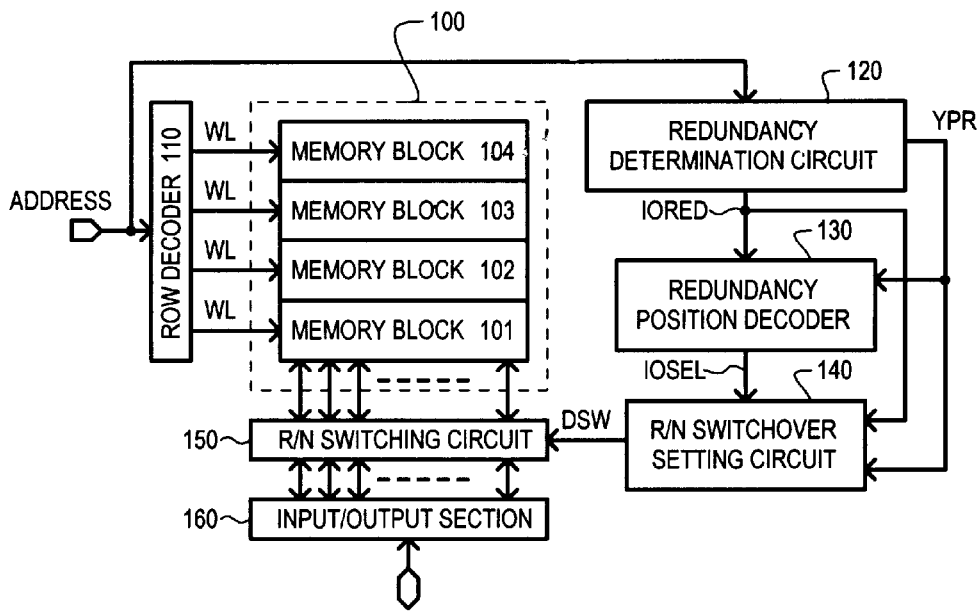
FIG. 1 is a block diagram showing a configuration of a main portion of a semiconductor memory device according to a first embodiment.

FIG. 1 is a block diagram showing a configuration of a main portion of a semiconductor memory device of a first embodiment of the present invention. In FIG. 1, reference symbol 100 denotes a memory cell array that is divided into four memory blocks 101 to 104. In each of the memory blocks 101 to 104, memory cells are arranged in a matrix-like manner with a plurality of normal cell arrays and redundancy cell arrays running in a column direction. Reference symbol 110 denotes a row decoder that decodes a received address and outputs a row selection signal (hereinafter referred to as "word line signal") WL to the memory blocks 101 to 104. In this embodiment, the row decoder 110 selects only one word line from a plurality of word lines existing in the four memory blocks.

A redundancy determination circuit 120 stores in advance, a flag that indicates whether or not a defective cell array should be replaced with a redundancy cell array on a memory block basis. In addition, a flag can indicate the position of a defective cell array that is to be replaced. When receiving an address signal, the redundancy determination circuit 120 outputs a redundancy selection signal YPR and a redundancy position signal IORED corresponding to the concerned memory block.

The redundancy selection signal YPR indicates whether or not defective cells in the memory block corresponding to the address should be replaced with redundancy cells. When set to a first logic level (a "1" for example), the signal YPR indicates that defective cells are present in a normal cell array and instructs such a normal cell array to be replaced with a redundancy cell array. When set to a second logic level (a "0" for example), the signal YPR indicates that no replacement with a redundancy cell array is required. The redundancy position signal IORED indicates the position of a normal cell array where defective cells are present. In this embodiment, the redundancy determination circuit 120 stores the position information by converting it into a binary form. The redundancy position signal IORED may be a three-bit signal for identifying one of eight normal cell arrays, a four-bit signal for identifying one of sixteen arrays, and a five-bit signal for identifying one of thirty-two arrays.

A redundancy position decoder 130 receives the redundancy selection signal YPR and the redundancy position signal IORED from the redundancy determination circuit 120. The redundancy position decoder 130 decodes the binary redundancy position signal IORED received from the redundancy determination circuit 120 when the redundancy selection signal YPR is in a select state, and outputs a defective position signal IOSEL. The defective position signal IOSEL has as many signal lines as the number of normal cell arrays. In the particular arrangement of FIG. 1, the signal line corresponding to a defective cell array will be driven to a logic "1" value, while the other signal lines will be driven to a logic "0."

An R/N switchover setting circuit 140 receives the defective position signal IOSEL. When the redundancy selection signal YPR is in the select state, the R/N switchover setting circuit 140 will output a bit line switching signal DSW in response to the IOSEL signal. The DSW signal enables switching from one bit line to another.

Reference symbol 150 denotes an R/N switching circuit that receives the bit line switching signal DSW and switches each cell array in the memory blocks 101 to 104 to a redundancy cell array or a normal cell array. Reference symbol 160 denotes an input/output section that reads and writes data from and to cells switched by the R/N switching circuit 150, the cells extending in the column direction.

Next, an operation of the semiconductor memory device shown in FIG. 1 will be described. While the following description refers to a case where data is read, substantially the same description may apply to a case where data is written.

In FIG. 1, upon reception of an address, the row decoder 110 decodes the received address and outputs a word line signal WL to a single memory block (101–104). As a result, a memory block (such as memory block 101, as but one example) is selected. This address is also supplied to the redundancy determination circuit 120.

The redundancy determination circuit 120 stores in advance the redundancy selection information for each memory block. Thus, the redundancy selection signal YPR that is generated will indicate whether or not a defective cell array in the selected memory block should be replaced with a redundancy cell array. In addition, the redundancy position signal IORED will indicate which defective cell array should be replaced. Upon reception of the address, the redundancy determination circuit 120 outputs not only the redundancy position signal IORED, corresponding to the concerned memory block, to the redundancy position decoder 130, but also the redundancy selection signal YPR to the redundancy position decoder 130 and the R/N switchover setting circuit 140.

Upon reception of the redundancy position signal IORED and the redundancy selection signal YPR outputted from the redundancy determination circuit 120, the redundancy position decoder 130 decodes the coded and stored redundancy information into the defective position signal IOSEL, and outputs the decoded signal IOSEL to the R/N switchover setting circuit 140.

The R/N switchover setting circuit 140 sends the decoded bit line switching signal DSW to the R/N switching circuit 150. The R/N switching circuit 150 switches and connects cell arrays within the selected memory block to the input/output section 160 based on the bit line switching signal DSW. The connection is such that the cell array having defective memory cells is bypassed. Thus, normal cell arrays and at least one redundancy cell array is connected to the input/output section 160.

Thus, information in a memory cell that is present at the point of intersection between the selected word line and bit line is read via the R/N switching circuit 150 and the input/output section 160.

Figure 2:
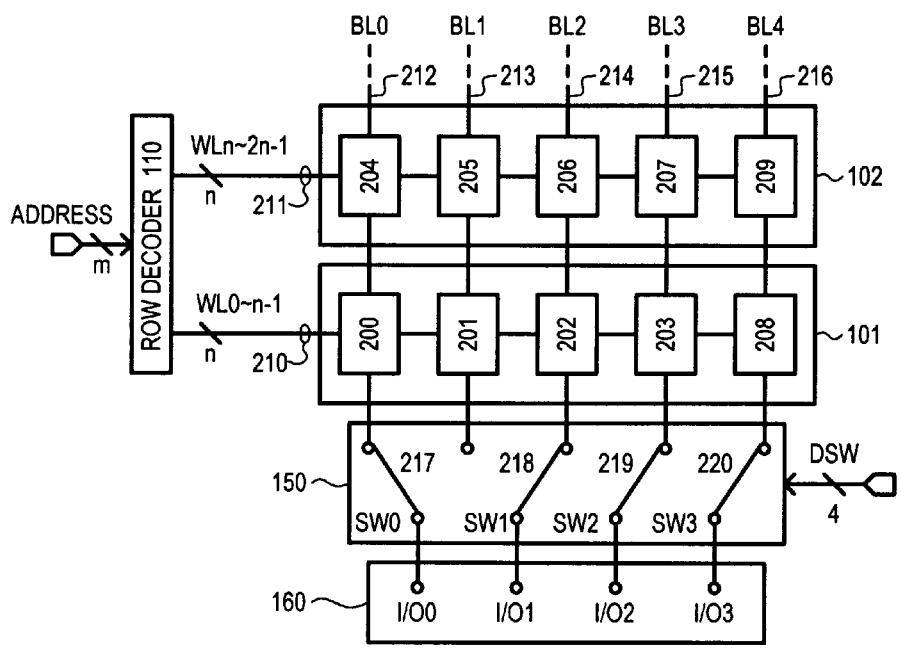
FIG. 2 is a block diagram showing a configuration of a main portion of memory blocks according to the first embodiment.
Figure 3:
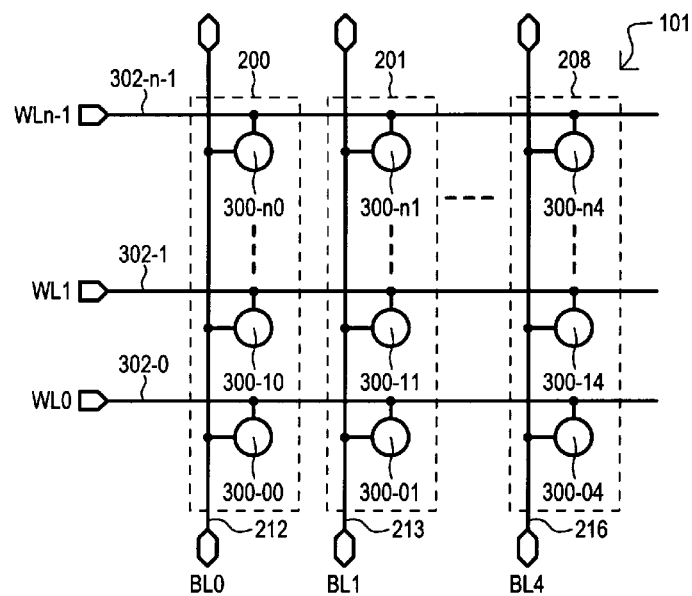
FIG. 3 is a block diagram showing a configuration of a main portion of memory cell arrays according to the first embodiment.

FIG. 2 is a block diagram showing a configuration of a main portion of memory blocks according to the first embodiment of the present invention. FIG. 3 is a block diagram showing a configuration of a main portion of a memory cell array. The following will describe a semiconductor memory device having four input/output lines I/O0 to I/O3. It is understood this represents but one particular embodiment, and should not be construed as limiting the present invention thereto.

In FIG. 2, reference symbols 200–207 denote normal cell arrays; 208 and 209 denote redundancy cell arrays; 210 and 211 denote groups of word lines (also shown as WL0 to WL2n-1); 212 to 216 denote bit lines (also shown as BL0 to BL4); and 217 to 220 denote switches (also shown as SW0 to SW3). FIG. 3 sets forth the memory block shown as 101 in FIG. 1, and is shown to include normal cell arrays 200 to 203, and redundancy cell array 208.

In FIG. 3, reference symbols 300-00 to 300-n4 denote single memory cells, which may be constructed of any readable and writable memory cell utilized in a volatile memory (such as a DRAM or SRAM) or a non-volatile memory (such as a PROM, EPROM, EEPROM or FRAM); 302-0 to 302-n-1 denote word lines (also shown as WL0 to WLn-1); and 212 to 216 denote bit lines (also shown as BL0 to BL4).

As illustrated by FIG. 3, in one configuration, each of the cell arrays (200, 201 . . . 208) can include a group of memory cells arranged in a column-wise direction. For example, in the particular arrangement of FIG. 3, the normal cell array 200 can include memory cells 300-00, 300-10 . . . to 300-n0; the normal cell array 201 can include memory cells 300-01, 300-11 to 300-n1; and the redundancy cell array 208 can include memory cells 300-04, 300-14 to 300-n4. Further, the memory cells (300-00 to 300-n4) in each cell array (200, 201 . . . and 208) are connected to a plurality of word lines (302-0 to 302-n-1) extending in the row direction and to bit lines (212 to 216) extending in the column direction, respectively. For example, the memory cells 300-00 to 300-04 are connected to the word line WL0 (302-0), and the memory cells 300-01 to 300-n1 to the bit line BL1 (213).

Further, as set forth in FIG. 2, each bit line (212 to 216) is connected to the switches (217 to 220) within the R/N switching circuit 150. The bit lines (212 to 216) may be connected to the switching circuit 150 by way of one or more of the following: sense amplifiers, column selection circuits, data amplifiers, erase circuits, or programming circuits (not shown).

A replacement bypassing operation utilizing the circuits set forth in FIGS. 2 and 3 will now be described. The particular replacement bypassing operation will use as an example the selection of word line WL0 and the reading of stored information from memory block 101.

The word line WL0 is selected by an address signal received from an outside device, and information stored in the memory cells (300-00 to 300-04) connected to the selected word line WL0 are read to the outside device through the bit lines BL0 to BL4 (212 to 216).

If there are no defective memory cells in the normal cell arrays (200 to 203), the R/N switching circuit 150 connects its switches 217 to 220 to the bit lines BL0 to BL3 (212 to 216), respectively. In this configuration, information stored in the memory cells 300-00 to 300-03 in the normal cell arrays (200 to 203) is read. Information in redundancy cell array 208 is not read.

Next, a case where one or more defective memory cells are present in the normal cell array 201 will be described. Since the normal cell array 201 is connected to the second bit line BL1, the redundancy determination circuit 120 converts this bit line BL1 into a binary code and stores the obtained code "01" in an area corresponding to the memory block 101 as a redundancy position signal IORED. Further, since the redundancy cell array 208 must be used, the circuit 120 stores "1" as the redundancy selection signal YPR.

To read the stored information from the memory block 101, the word line 210 (WL0) is selected. In addition, "01" and "1" are outputted from the redundancy determination circuit 120 as the redundancy position signal IORED and as the redundancy selection signal YPR, respectively. The redundancy position decoder 130 decodes the redundancy position signal IORED "01" and outputs "0100" as the defective position signal IOSEL. Each bit information of the decoded data "0100" corresponds to each of the bit lines BL0 to BL4. Since the second bit is "1," it can be understood that the memory cell array where the defective cells are present is connected to the bit line BL1.

The R/N switchover setting circuit 140 converts the decoded data "0100" to generate four bit line switching signals DSW0 to DSW3 (shown collectively as "DSW" in FIGS. 1 and 2). The DSW signals are supplied to the R/N switching circuit 150. The switches (217 to 220) within the R/N switching circuit 150 are connected to one particular bit line when the switching signals (DSW) are "0" and to another particular bit line when the switching signals are "1". In the view of FIG. 2, the switches will be connected to bit lines on the left when their corresponding bit line switching signal (DSW) is "0," and to the bit lines on the right when their corresponding signal DSW is "1." To set the switches as shown in FIG. 2, "0111" may be inputted to the R/N switching circuit 150 as bit line switching signals DSW0 to DSW3.

Since the normal cell array 201 has one or more defective cells in this case, the switch 217 is connected to the bit line BL0 (212) on the left, and the switches 218 to 220 to the bit lines BL2 to BL4 (214–216) on the right. With this operation, the information stored in the normal cell arrays 200, 202, 203 and the redundancy cell array 208 can be read through the bit lines BL0, and BL2 to BL3 (212, 214 to 216). Therefore, the information can be read by bypassing the normal cell array 201 where defective cells are present. Hence, even if there is only one defective memory cell array 201 in the memory block 101, the semiconductor memory device can be saved without being discarded as defective.

It is understood that the above-described redundancy operation can be used to bypass other types of defects in the column-wise data path. As just a few examples, it may be possible to bypass defective sense amplifiers, column selection circuits, data amplifiers, erase circuits, or programming circuits.

Figure 4:
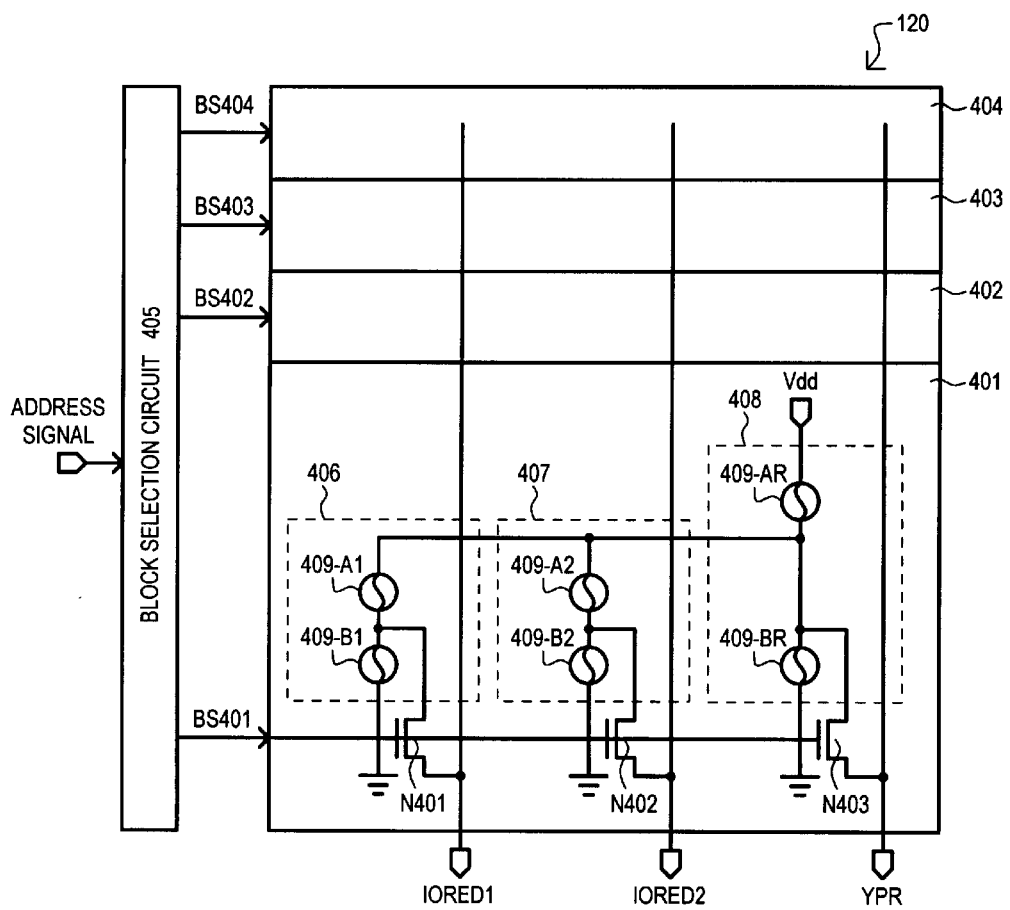
FIG. 4 is a block diagram showing a redundancy determination circuit according to the first embodiment.

FIG. 4 is a block diagram showing a configuration of the redundancy determination circuit 120. The redundancy determination circuit 120 includes fuse blocks 401 to 404 and a block selection circuit 405. Block selection circuit 405 selects one fuse block from the fuse blocks 401 to 404. The fuse blocks 401 to 404 correspond to the memory blocks 101 to 104, respectively. That is, as just one example, when the memory block 101 is selected by an address, the block selection circuit 405 of the redundancy determination circuit 120 outputs "1" as a block selection signal BS401, and thereby selects the fuse block 401. Further, when the memory block 102 is selected by an address, the circuit 405 outputs "1" as a block selection signal BS402 to select the fuse block 402.

Each fuse block (401 to 404) includes fuse circuits 406 and 407, a fuse circuit 408, and n-type transistors N401 to N403. In the particular arrangement of FIG. 4, the number of fuse circuits is expressed as log2B when the number of normal cell arrays is B. For example, the number of fuse circuits is two for four normal cell arrays, because B is equal to four. Thus, two fuse circuits may be provided for four arrays and five fuse circuits may be provided for thirty-two arrays to store the position of a defective cell array.

The fuse circuit 408 outputs the redundancy selection signal YPR that indicates whether or not a redundancy cell array (such as 208 or 209 as just one example) should be used for a memory block selected by an address.

Further, the fuse circuits 406 and 407 specify the position of a single defective cell array among four normal cell arrays (such as 200–203 or 204–207) in the memory block selected by the address. The position information is stored by converting it into a binary code. Since there are four normal cell arrays in each memory block in the particular embodiment illustrated, two fuse circuits 406 and 407 are enough to specify the position of a normal cell array that has been found defective. The fuse circuits 406 and 407 output redundancy position signals IORED1 and IORED2, respectively, to the redundancy position decoder 130.

The signal lines of the redundancy position signals IORED1 and IORED2 and the redundancy selection signal YPR are connected to the fuse blocks (401 to 404), and also to the fuse circuits through the transistors N401 to N403 incorporated in the fuse blocks (401–404). A fuse block selection signal (BS401 to BS404) is supplied to the gate of each of the transistors N401 to N403 (i.e., fuse block selection signal BS401 will be applied to the gates of transistors N401 to N403 within fuse block 401). When the fuse block selection signal BS is "1," the transistors N401 to N403 turn on, whereas when the signal BS is "0," the transistors turn off. One of the fuse block selection signals BS401 to BS404 is set to "1" in accordance with an inputted address, and the information in either one of the fuse circuits belonging to the selected one of the fuse blocks 401 to 404 is outputted.

The fuse circuit 408 includes two fuses 409-AR and 409-BR. The fuses 409-AR and 409-BR are connected not only to each other but also to the drain of the transistor N403 at one end. The fuse 409-AR is connected to a power supply Vdd at the other end, and the fuse 409-BR to the ground at the other end. If a redundancy cell array (such as 208 or 209) is used for a selected memory block, the fuse 409-BR is disconnected, and the fuse circuit 408 outputs "1" as the redundancy selection signal YPR. If no redundancy cell array (such as 208 or 209) is used, the fuse 409-AR is disconnected, and the fuse circuit 408 outputs "0."

The fuse circuit 406 has fuses 409-A1 and 409-B1, and the fuse circuit 407 has fuses 409-A2 and 409-B2. These fuses are commonly connected to the drains of the transistors N401 and N402 at one end. The fuses 409-A1 and 409-A2 are also connected to the common nodes of the fuses 409-AR and 409-BR at the other end, and the fuses 409-B1 and 409-B2 to the ground at the other end.

Further, the gates of the transistors N401 to N403 are connected to the block selection circuit 405, and their drains, to each output signal line of IORED1, IORED2 and YPR. When, as just one example, the memory block 101 is selected by an address, the block selection circuit 405 outputs "1" as the fuse block selection signal BS401, so that transistors N401 to N403 within fuse block 401 turn on to output the information stored in the fuse block 401. When another fuse block, such as the fuse block 402 is selected, the transistors N401 to N403 of the fuse block 401 turn off, and the information stored in the fuse block 402 is outputted.

For example, when there are defective cells in the normal cell array 201, the redundancy determination circuit 120 stores "01" as the redundancy position signal IORED. In this case, the fuses 409-B2, 409-A1, 409-BR are disconnected. Thus, when the fuse block selection signal BS401 is selected (at a "1" value) the redundancy determination circuit 120 outputs "0," "1" and "1" as the signals IORED1, IORED2 and YPR, respectively.

Further, when no replacement with a redundancy cell array is required for the selected memory block, the redundancy determination circuit 120 can output "0," "0" and "0" as the signals IORED1, IORED2 and YPR, respectively. This can be accomplished by disconnecting only the fuse 409-AR without disconnecting any other fuses (409-B1, 409-A1, 409-B2 and 409-A2. As a result, the fuse disconnection step can be shortened.

It is noted that the series arrangement of fuses (409-A1/409-B1, 409-A2/409-B2, and 409-AR/409-BR) in FIG. 4 may be undesirable as such an arrangement presents a "short-circuit" condition between the power supply Vdd and ground prior to redundancy information being stored within the fuse circuits (406, 407 and 408). To overcome this arrangement, each fuse circuit can have a transistor inserted into the short-circuit current path (not shown in FIG. 4).

In this way, when a defective normal cell array is to be replaced, the fuse circuit 408 of the redundancy determination circuit 120 outputs "1" as the redundancy selection signal YPR to the redundancy position decoder 130, and the fuse circuits 406 and 407 of the redundancy determination circuit 120 output two-bit signals IORED1 and IORED2 (shown collectively as IORED in FIG. 1) specifying the position of a defective cell array in a selected memory block. The redundancy position decoder 130 converts the received IORED signals into four-bit defective position signals IOSEL0 to IOSEL3 (shown collectively as IOSEL in FIG. 1), in which any one of the four bits is set to "1." The converted four-bit defective position signals IOSEL0 to IOSEL3 is output to the R/N switchover setting circuit 140.

Figure 5:
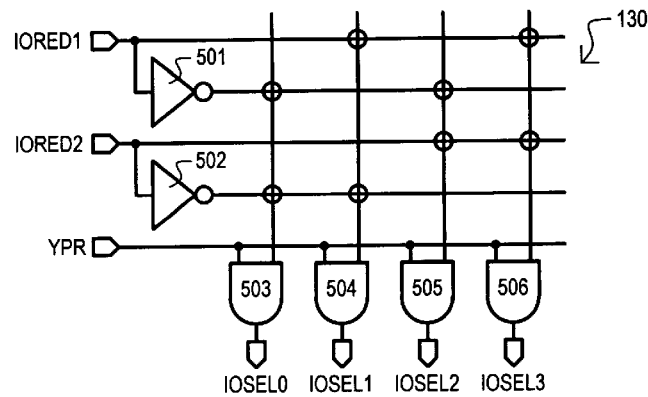
FIG. 5 is a circuit diagram showing a configuration of a redundancy position decoder according to the first embodiment.

FIG. 5 is a circuit diagram showing an exemplary circuit configuration of the redundancy position decoder 130. This is an example in which the decoder 130 obtains defective position signals IOSEL0 to IOSEL3 by receiving the two-bit selection signals IORED1 and IORED2.

The redundancy position decoder 130 of FIG. 5 includes inverters 501 and 502, and AND gates 503 to 506. The inverters 501 and 502 receive the signals IORED1 and IORED2, respectively, as inputs. The AND gates 503 to 506 receive the signal YPR as one input, and each have one input connected to the nodes encircled in the drawing. When the signals IORED2 and IORED1 are "0" and "1", respectively, and the signal YPR is "1," the inverter 502 outputs "1". These values allow the redundancy position decoder 130 to output "0010" as the defective position signals IOSEL3 to IOSEL0 by setting the output of AND gate 504 to "1" and the outputs of AND gates 503, 505 and 506 to "0."

One skilled in the art would recognize that the decoder of FIG. 5 generates logic low signals in response to conflicting logic signals. It is understood that such a circuit could be modified to utilize three input AND gates, in which each AND gate receives the YPR signal as an input, with the other two inputs being coupled to a different of the indicated nodes.

Figure 6:
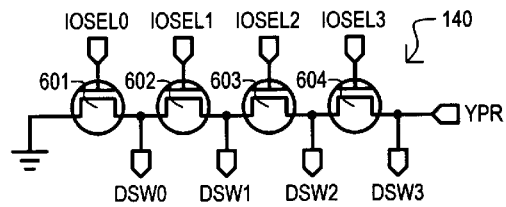
FIG. 6 is a circuit diagram showing an R/N switchover setting circuit according to the first embodiment.

FIG. 6 is a circuit diagram showing a configuration of the R/N switchover setting circuit 140. This is an example in which the circuit 140 receives the four-bit redundancy position signals IOSEL0 to IOSEL3 and the redundancy selection signal YPR, and outputs the four-bit bit line switching signals DSW0 to DSW3.

The R/N switchover setting circuit 140 includes four p-type transistors 601 to 604 that are connected in series with one another. The ground potential "0" is supplied to the drain of the transistor 601, and the redundancy selection signal YPR to the source of the transistor 604. The gates of the transistors 601 to 604 receive the defective position signals IOSEL0 to IOSEL3 decoded by the redundancy position decoder 130, respectively.

When a defective position signal (such as IOSEL0 to IOSEL3) is "1," the corresponding transistor (601 to 604) turns off, whereas when a defective position signal (such as IOSEL0 to IOSEL3) is "0," the corresponding transistor (601 to 604) turn on. For example, when no replacement with a redundancy cell array (such as 208) is required for the memory block 101, the redundancy selection signal YPR is "0" and the defective position signals IOSLE0 to IOSEL3 are "0000." Transistors 601 to 604 turn on, outputting "0000" as the bit line switching signals DSW0 to DSW3.

When defective memory cells are present in the normal cell array 201, so that the defective memory cells must be replaced by using a redundancy cell array (such as 208), the redundancy selection signal YPR is "1" and the defective position signals IOSLE0 to IOSEL3 are "0100." That is, IOSEL0, IOSEL2 and IOSEL3 are set to "0" and IOSEL1 is set to "1." As a result, the transistor 602 turns off and the transistors 601, 603 and 604 turn on.

Since the bit line switching signal DSW0 is connected to the ground potential "0" through the transistor 601 (which has been turned on) the signal DSW0 is set to "0." Further, since the bit line switching signal DSW1 is connected to the redundancy selection signal YPR that is set to "1" (through the transistors 603 and 604 that have been turned on), the signal DSW1 is set to "1." The bit line switching signals DSW2 and DSW3 are similarly set to "1." Therefore, "0111" is outputted as the bit line switching signals DSW0 to DSW3.

The thus converted bit line switching signals DSW0 to DSW3 are outputted to the R/N switching circuit 150 to control the switching directions of the switches SW0 to SW3 incorporated in the R/N switching circuit 150. Based on these bit line switching signals DSW0 to DSW3, the R/N switching circuit 150 switches and connects three of the four-bits output from the normal cell arrays, and one bit from a redundancy cell array to the four lines I/O0 to I/O3 within the input/output section 160.

As described above, the R/N switchover setting circuit 140 shown in FIG. 6 can generate the bit line switching signals DSW with a simple circuit configuration and at a high speed. By turning off one of the transistors constituting the series of setting circuits, "0" can be set to all the bit line switching signals DSW to one side of the turned off transistor (the left side in FIG. 6), and "1" can be set to all the signals DSW on the other side of the turned off transistor (the right side in FIG. 6).

Figure 7:
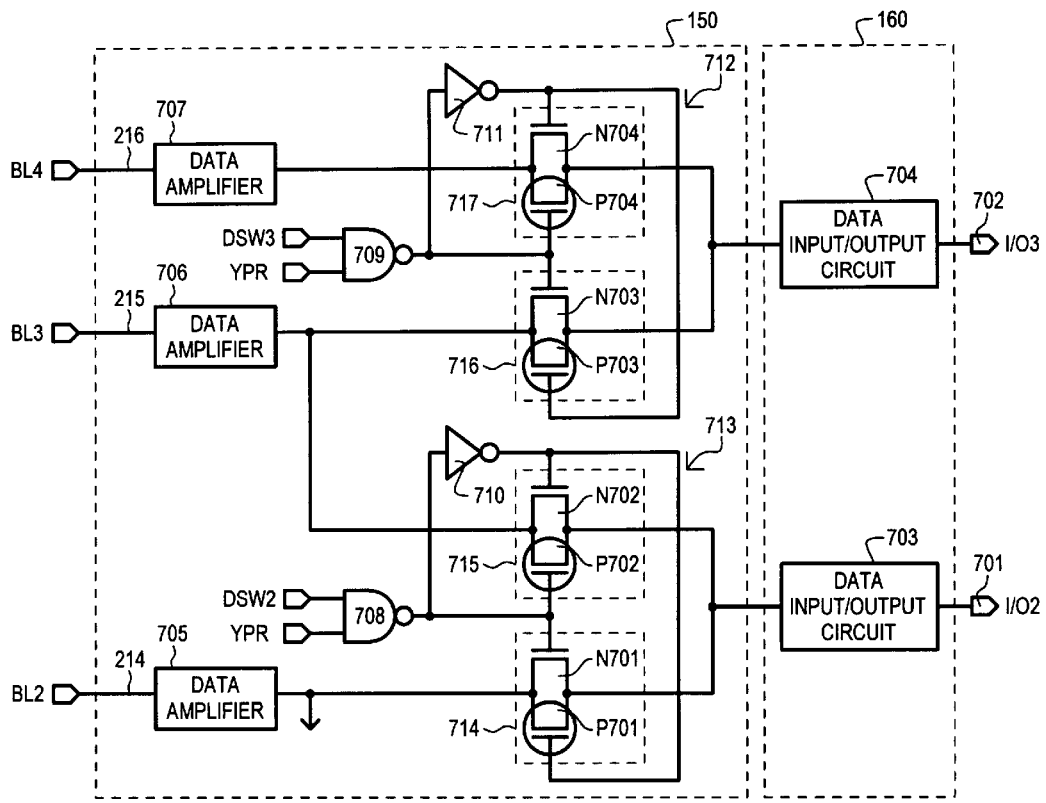
FIG. 7 is a circuit diagram showing a specific configuration of the R/N switchover circuit and that of an input/output section.

FIG. 7 is a circuit diagram partially showing a specific configuration of the R/N switching circuit 150 and the input/output section 160. This is a portion in which the outputs of the bit lines BL2 to BL4 (214–216) are switched between the input/output signal lines I/O2 and I/O3 (701 and 702) of the input/output section 160.

In FIG. 7, the input/output section 160 includes data input/output circuits 703 and 704. The data input/output circuits 703 and 704 couple amplified outputs of the R/N switching circuit 150 to the input/output signal lines I/O2 and I/O3 (701 and 702).

The R/N switching circuit 150 includes the following components. Reference symbols 705 and 706 denote data amplifiers that amplify data of the bit lines BL2 and BL3 connected to the normal cell arrays (such as 202 or 203); 707 denotes a data amplifier that amplifies data from the redundancy cell array (such as 208) on the bit line BL4; 708 and 709 denote NAND gates; P701 to P704 denote p-type transistors; N701 to N704 denote n-type transistors; and 710 and 711 denote inverters. The outputs of the memory cells are temporarily amplified by sense amplifiers (not shown) and then applied to the data amplifiers 705 to 707 via the bit lines 214 to 216.

The source and drain of each n-type transistors (N701 to N704) are connected to those of each p-type transistor (P701 to P704), respectively. In addition, an inverter (710 and 711) is inserted between the gate of each n-type transistor (N701 to N704) and that of each corresponding p-type transistor (P701 to P704), mutually applying signals that are complementary to each other. The resulting structure forms two switches shown as 712 and 713. So called "transfer gates" are formed by n-type transistors (N701 to N704) and their corresponding p-type transistors (P701 to P704) utilizing the inverters (710 and 711). A first transfer gate 714 is formed by the transistors N701 and P701; a second transfer gate 715 by the transistors N702 and P702; a third transfer gate 716 by the transistors N703 and P703; and a fourth transfer gate 717 by the transistors N704 and P704.

The first and third transfer gates 714 and 716 turn off at their source-drain circuit when the outputs of the NAND gates 708 and 709 are "0," and turn on when the outputs of the NAND gates are "1." Conversely, the second and fourth transfer gates 715 and 717 turn off at their source-drain circuit when the outputs of the NAND gates 708 and 709 are "1," and turn on when the outputs of the NAND gates are "0."

In FIG. 7, two transfer gates (714/715 or 716/717) are connected to a single data input/output circuit (703 or 704), and either one of the transfer gates within a pair is supposed to turn on. As a result, either one of the two data amplifiers (705/706 or 706/707) is selected. An alternative way of viewing the arrangement is that one of two bit lines (214/215 or 215/216) is selected so that the data of the selected bit line can be outputted to a single input/output line I/O (701 or 702).

Next, an operation of the R/N switching circuit 150 will be described.

First, a case where no redundancy cell array (such as 208 or 209) is used and the redundancy selection signal YPR is thus set to "0" will be described. In this case, the bit line switching signals DSW (DSW0–DSW3) may be set to any state.

Each of the NAND gates 708 and 709, which receives "0" as the redundancy selection signal YPR, outputs "1." Therefore, the transfer gates 714 and 716 turn on, and the transfer gates 715 and 717 turn off. As a result, the data on the bit lines BL2 and BL3 (214 and 215) are outputted to the input/output lines I/O2 and I/O3 (701 and 702), respectively, via the data amplifiers 705 and 706, transfer gates 714 and 716 and the data output circuits 703 and 704, respectively.

Next, a case will be described where defective cells are present in a normal cell array (such as 203 and 207) connected to the bit line BL3, and such array is to be replaced with a redundancy cell array (such as 208 or 209). In this case, the redundancy selection signal YPR is "1," and the bit line switching signals DSW2 and DSW3 are "0" and "1," respectively.

The NAND gate 708, which receives "0" as the bit line switching signal DSW2, outputs "1." Therefore, the transfer gate 714 turns on and the gate 715 turns off. As a result, the data on the bit line BL2 (214) is outputted to the input/output line I/O2 (701).

Further, the NAND gate 709, which receives a "1" as the bit line switching signal DSW3 and a "1" as the redundancy selection signal YPR, outputs "0." Therefore, the transfer gate 717 turns on, and the gate 716 turns off. As a result, the data on the bit line BL4 (216) is outputted to the input/output line I/O3 (702). When defective cells are present on the bit line BL3 (215) as described above, switching is effected so that the output of the data amplifier 707, i.e., the data from a redundancy cell array (such as 208 or 209) is outputted to the input/output line I/O3 (702) without using the output of the data amplifier 706.

Next, a case where defective cells are present in the normal cell array (such as 202 or 206) connected to the bit line BL2 and such array is to be replaced with a redundancy cell array (such as 208 or 209) will be described. In this case, the redundancy selection signal YPR is "1," and the bit line switching signals DSW2 and DSW3 are "1" and "1," respectively.

Both the NAND gates 708 and 709, which receive "1" as the bit line switching signals DSW2 and DSW3, output "0."

Therefore, the transfer gates 715 and 717 turn on, and the gates 714 and 716 turn off. As a result, the data on the bit lines BL3 and BL4 (215 and 216) are outputted to the input/output lines I/O2 and I/O3 (701 and 702).

Thus, when defective cells are present on the bit line BL2 (214), switching can be effected so that the data from the data amplifier 706 is outputted to the input/output line 1/O2 without using the data from the data amplifier 705.

Referring once again to FIGS. 1 to 7, the operation of the first embodiment will be reviewed. The position information of a defective cell is stored in the redundancy determination circuit 120 on a memory block basis. An address is applied, and the position of a memory block (101–104) accessed by the address signal is determined. Then, the position information of the defective cell in the accessed memory block is outputted from the redundancy determination circuit 120, and the R/N switching circuit 150 effects a switching operation that bypasses the output of defective cell by including the output of a redundancy cell.

Therefore, even if there is a single defective cell in each memory block (101–104), such defective cells can be replaced with a redundancy cell array (such as 208 or 209). For example, if normal cell arrays 201 and 205 are defective, they can be bypassed by utilizing redundancy cell arrays 208 and 209. Alternatively, if normal cell arrays 201 and 207 are defective, they can also be bypassed by utilizing redundancy cell arrays 208 and 209. By thus dividing a normal cell array into four memory blocks, a single defective cell array per memory block can be replaced, which means four defective cell arrays can be bypassed in the particular example of FIGS. 1 and 2. Of course, the number of memory blocks is not limited to four, but may be increased or decreased appropriately. Further, if redundancy circuits in the row direction are utilized with the above-described column redundancy approach, two or more defective memory cells in different normal cell arrays can be also replaced.

Still further, since the R/N switching circuit 150 is shared in common with the memory blocks (101–104), the circuit size can be significantly reduced compared with the configuration in which an R/N switching circuit is provided per memory block.

Furthermore, the R/N switchover setting circuit 140 is constructed of transistor switches, so that a normal cell array (such as a 200–207) can be switched with a redundancy cell array (such as 208 and 209) on a software basis. As a result, there is no need to provide a fuse circuit and an R/N switching circuit per memory block. Hence, the circuit size can be reduced and the number of fuses, whose size is larger than that of the transistors, can be reduced, and thus the chip area can be reduced.

Furthermore, the position information of a defective cell array is stored while encoded into a binary number, so that the number of fuses can be further reduced. Hence, the fuse disconnection step (fuse programming) can be shortened in addition to reducing the chip area. Moreover, only one fuse that stores the redundancy selection signal is required to be disconnected when a redundancy cell array is not used, so that the fuse disconnection step can be further shortened.

Further, in the conventional examples, a plurality of bit line switching signals to be supplied to an R/N switching circuit have been set to a shift register through shifting, or set to control memory cells bit by bit. Therefore, the setting operation is very time-consuming, increasing memory access time for reading/writing. In the first embodiment, a plurality of bit line switching signals (DSW) are generated collectively within a short period of time by the R/N switchover setting circuit 140 where transistors are connected in series with one another, and outputted in parallel. Therefore, this embodiment can save a significantly larger amount of time, when setting the values that establish bit line switching, than the conventional example.

Figure 8:
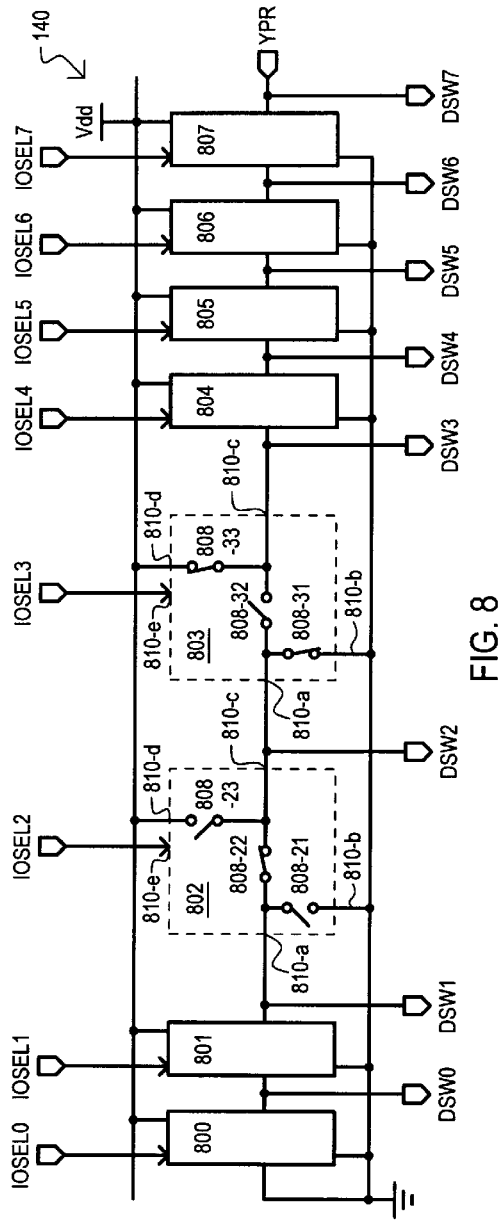
FIG. 8 is a circuit diagram showing a configuration of an R/N switchover setting circuit according to a second embodiment.

FIG. 8 is a circuit diagram showing an R/N switchover setting circuit according to a second embodiment of the present invention. In this embodiment, each of memory blocks 101 to 104 includes eight normal cell arrays and a single redundancy cell array. Therefore, an R/N switchover setting circuit 140 receives eight-bit defective position signals IOSLE0 to IOSEL7 from a redundancy position decoder 130 and a redundancy selection signal YPR from a redundancy determination circuit 120. In response to the various inputs, the second embodiment R/N switchover setting circuit outputs eight bit line switching signals DSW0 to DSW7.

The R/N switchover setting circuit 140 according to this embodiment includes eight setting circuits 800 to 807. Each of the setting circuits 800 to 807 has three switch circuits 808-n1 to 808-n3 (where n=0 to 7), and five terminals 810-a, -b, -c, -d and -e. The terminal 810-a of a setting circuit 802 is connected to the terminal 810-c of an adjacent setting circuit. The terminal 810-a of the setting circuit 800 is connected to the ground. The terminal 810-c of a setting circuit is connected to the terminal 810-a of an adjacent setting circuit. The terminal 810-c of the setting circuit 807 is connected to the redundancy determination circuit 120 to receive the redundancy selection signal YPR.

The terminals 810-b and 810-d of each of the setting circuits 800 to 807 are connected to the ground and a power supply, respectively, and receive logic levels "0" and "1," respectively. Further, the terminal 810-e is connected to the redundancy position decoder 130 to receive a defective position signal IOSEL.

Still further, the terminal 810-c of each of the setting circuits 800 to 807 is connected to the R/N switching circuit 150, so that the circuit 150 outputs the logic levels at the terminals 810-c as the bit line switching signals DSW0 to DSW7.

The switch circuits 808-n0 to 808-n3 of each of the setting circuits (800 to 807) are switched upon input of a signal level to the terminal 810-e. For example, when "0" is set at the terminal 810-e of a setting circuit (800 to 807), the switches 808-n1 and 808-n3 turn off and the switches 808-n2 turns on. This particular response is illustrated in setting circuit 802 in FIG. 8. When "1" is set at the terminal 810-e of a setting circuit (800 to 807), the switches 808-n1 and 808-n3 turn on and the switch 808-n2 turns off, setting the terminal 808-a of such setting circuit (800–807) to "0" and its terminal 808-c to "1." This particular response is illustrated in setting circuit 803 of FIG. 8.

Since the terminal 810-a of the setting circuit 800 on the leftmost end as viewed in FIG. 8 is connected to the ground, the switch 808-01 (not shown) within setting circuit 800 may be omitted. Further, since the terminal 810-c of the setting circuit 807 on the rightmost end as viewed in FIG. 8 receives the redundancy selection signal YPR, the switch 808-73 (not shown) within such setting circuit may also be omitted.

Next, an operation of the R/N switchover setting circuit 140 according to the embodiment of FIG. 8 will be described.

The following describes a case where no replacement with a redundancy cell array is required (i.e., a case where the redundancy selection signal YPR is "0" and the defective position signals IOSLE0 to IOSEL7 are "00000000"). In this case, the switches 808-n1 and 808-n3 within each of the setting circuits 800 to 807 turn off and the switch 808-n2 turns on. Thus, "0" is set at the terminals 810-a and 810-c of each setting circuit (800–807), setting the bit line switching signals DSW0 to DSW7 to "00000000."

The following describes a case where defective cells are present in a normal cell array connected to a bit line BL3, and such normal cell array is bypassed by utilizing a redundancy cell array. In this case, the redundancy selection signal YPR is "1" and the defective position signals IOSLE0 to IOSEL7 are "00010000." Therefore, the switches 808-31 and 808-33 of the setting circuit 803 turn on and the switch 808-32 turns off. At the same general time, the switches 808-n1 and 808-n3 within each of the other setting circuits 800 to 802 and 804 to 807 turn off, and the switch 808-n2 turns on. As a result, "0" is set at the terminal 810-a of the setting circuit 803 and "1" at its terminal 810-c. The terminals 810-c of the setting circuits 800 to 802 (i.e., the bit line switching signals DSW0 to DSW2) remain at the "000" value.

At the same time, since the switch 808-33 turns on, "1" is set at the terminal 810-c of the setting circuit 803. As a result, the bit line switching signal DSW3 is set to "1" immediately. Further, since the redundancy selection signal YPR is also "1," the bit line switching signal DSW7 is also set to "1" immediately. Still further, "1" set at the terminal 810-c of the setting circuit 803 causes the setting circuit 804 to set the bit line switching signal DSW4 to "1." Similarly, the logic level "1" is propagated to the setting circuits 805, 806 and 807, setting the bit line switching signals DSW5 to DSW7 to "1." Furthermore, the logic level "1" of the redundancy selection signal YPR is similarly propagated to the setting circuits 807, 806 and 805, also setting the bit line switching signals DSW4 to DSW7 to "1."

Thus, the logic level "1" is supplied to the bit line switching signals DSW4 to DSW7 both from the setting circuit 803 side and from the redundancy selection signal YPR input side simultaneously. Therefore, the bit line switching signals DSW4 to DSW7 can be activated at a higher speed than the conventional device and the first embodiment. As a result, the R/N switching circuit 150 can be switched at a higher speed, which in turn prevents the memory access time from being increased even if the redundancy cells are arranged in the column direction.

Figure 9:
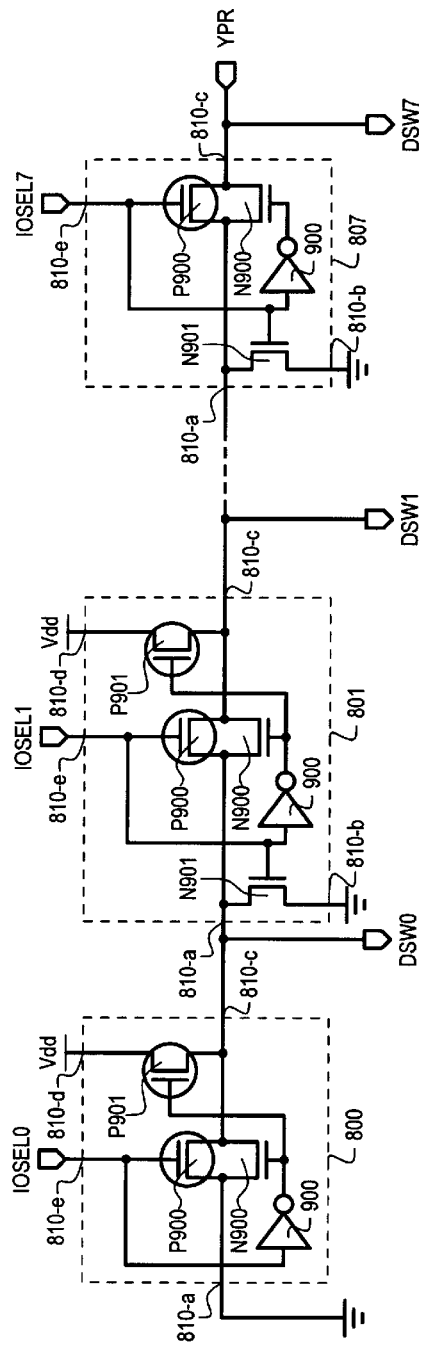
FIG. 9 is a circuit diagram of setting circuits according to the second embodiment.

FIG. 9 shows a detailed circuit diagram example of the setting circuits 802 to 806, and 800 and 807 of FIG. 8.

In setting circuit 801 of FIG. 9, reference symbols P900 and P901 denote p-type transistors; N900 and N901 denote n-type transistors; and 900 denotes an inverter. The source-drain paths of transistors N900 and P900 are connected in parallel to each other. The common nodes of transistors N900 and P900 are connected to the terminals 810-a and 810-c, respectively. The gate of the transistor P900 is connected to the terminal 810-e, and the gate of the transistor N900 to the terminal 810-e through the inverter 900. The transistors N900 and P900 and the inverter 900 constitute the switch 808-n2.

When "0" is set at the terminal 810-e, the gates of the transistors N900 and P900 are set to "1" and "0," respectively, causing the transistors N900 and P900 to turn on, and setting the same logic level at the terminals 810-a and 810-c, respectively. When "1" is set at the terminal 810-e, the gates of the transistors N900 and P900 are set to "0" and "1,"respectively, causing the transistors N900 and P900 to turn off. This isolates terminals 810-a and 810-c from one another with a high impedance path, allowing the terminals to be driven to different logic levels.

The drain of the transistor N901 is connected to the terminal 810-a, its source to the terminal 810-b, and its gate to the terminal 810-e. Transistor N901 thus constitutes the switch 808-n1. When "0" is set at the terminal 810-e, the transistor N901 turns off. When "1" is set at the terminal 810-e, the transistor N901 turns on, setting the same logic level at both the terminals 810-a and 810-b. Since the terminal 810-b is connected to the ground, the terminal 810-a will be set to the logic level "0."

The drain of the transistor P901 is connected to the terminal 810-c, its source to the terminal 810-d, and its gate to the terminal 810-e through the inverter 900. Transistor P901 thus constitutes the switch 808-n3. When "0" is set at the terminal 810-e, the transistor P901 turns off. When "1" is set at the terminal 810-e, the transistor P901 turns on, setting the same logic level at both the terminals 810-c and 810-d. Since the terminal 810-d is connected to the power supply, terminal 810-c will be set to the logic "1" value.

Thus, when the transistors N900 and P900 turn on, the transistors N901 and P901 turn off, and when the transistors N900 and P900 turn off, the transistors N901 and P901 turn on. As a result, when "0" is set at the terminal 810-e, the same logic level is set at the terminals 810-a and 810-b, whereas when "1" is set at the terminal 810-e, "0" is set at the terminal 810-a and "1" at the terminal 810-c.

The setting circuit 800 is also set forth in a detailed circuit diagram in FIG. 9. The setting circuit 800 of FIG. 9 has a configuration that is essentially to that of setting circuit 801, except that the transistor N901 is eliminated. Since the terminal 810-a of the setting circuit 800 is connected to the ground, the circuit 800 performs the same general operation as that of setting circuit 801.

FIG. 9 further sets forth a detailed circuit diagram of setting circuit 807. The setting circuit 807 of FIG. 9 has a configuration identical to that of setting circuit 801, except that the transistor P901 is eliminated. Since the terminal 810-c of the setting circuit 807 is connected to the redundancy selection signal YPR, the circuit 807 performs the same operation as that of setting circuit 801.

Thus, in this embodiment, a plurality of setting circuits 800 to 807 are connected in series with one another by terminals 810-a and 810-c. Within a setting circuit (800–807) a terminal 810-a can be disconnected from its corresponding terminal 810-c, while the other terminals are connected to one another. In addition, for the disconnected terminals 810-a and 810-c, a second logic level "0" can be set at the terminal 810-a and a first logic level "1" can be set at terminal 810-c. As a result, the bit line switching signals (DSW) connected to these disconnected terminals can be set to the desired logic levels instantly.

Further, in the second embodiment, when the terminal 810-a is disconnected from terminal 810-c within a setting circuit, the resulting "0" values are generated by "0" values converging from two different nodes. In particular, the "0" value will propagate from terminal 810-a within setting circuit 800, and also from terminal 810-a within the setting circuit in which terminal 810-a is disconnected from terminal 810-c. Therefore, the bit line switching signals DSW can be set to "0" within a shorter period of time than the case where "0" is propagated only from the terminal 810-a of the setting circuit 800.

Still further, in the second embodiment, when the terminal 810-a is disconnected from terminal 810-c within a setting circuit, the resulting "1" values are generated by "1" values converging from two different nodes. In particular, the "1" value will propagate from terminal 810-c within setting circuit 807 (the YPR signal), and also from terminal 810-c within the setting circuit in which terminal 810-a is disconnected from terminal 810-c. Therefore, the bit line switching signals DSW can be set to "1" within a shorter period of time than the case where "1" is propagated only from the redundancy signal line YPR terminal.

Therefore, the bit line switching signals DSW can be set to the desired logic levels at a higher speed than the conventional device and the first embodiment. As a result, the R/N switching circuit 150 can be switched at a higher speed, which in turn, prevents the memory access time from being increased even if the redundancy cells are arranged in the column direction.

A third embodiment will now be described. In this embodiment, each of memory blocks (101 to 104) includes thirty-two normal cell arrays and a single redundancy cell array.

Figures 10, 11:
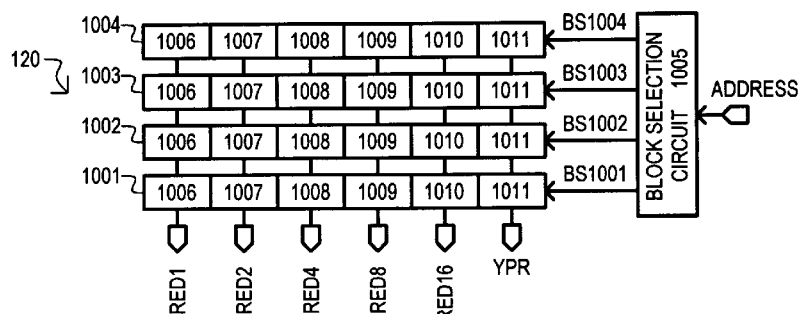
FIG. 10 is a block diagram showing a configuration of a redundancy determination circuit according to a third embodiment.
FIG. 11 is a diagram showing a truth table for the redundancy determination circuit and a redundancy position decoder.

FIG. 10 is a block diagram showing a configuration of a redundancy determination circuit 120 according to a third embodiment of the present invention. The redundancy determination circuit 120 includes fuse blocks 1001 to 1004 and a block selection circuit 1005 that selects one fuse block from these fuse blocks. The block selection circuit 1005 outputs fuse block selection signals BS1001 to BS1004, each of which selects one fuse block.

The fuse blocks 1001 to 1004 correspond to the memory blocks 101 to 104, respectively. For example, when the memory block 101 is selected by an address, the redundancy determination circuit 120 causes the block selection circuit 1005 to set the fuse block selection signal BS1001 to "1" so that the fuse block 1001 is selected. Further, when the memory block 102 is selected by an address, the redundancy determination circuit 120 causes the block selection circuit 1005 to set the fuse block selection signal BS 1002 to "1" so that the fuse block 1002 is selected.

Each fuse block includes five fuse circuits 1006 to 1010 and a single fuse circuit 1011. The fuse circuit 1011 outputs the aforementioned redundancy selection signal YPR that indicates whether or not the redundancy cells are used for cells in the memory block selected by an address. When the redundancy cells are used, the redundancy selection signal YPR is "1," and the signal YPR is "0" otherwise.

Further, the five fuse circuits 1006 to 1010 store, in the form of a binary number, the position of an array, among the thirty-two normal cell arrays, that is defective (due to one or more defective cells). The defective array can then be replaced by a redundancy array. The redundancy determination circuit 120 outputs five-bit binary redundancy position signals IORED1, IORED2, IORED4, IORED8, IORED16 from the fuse circuits, with the IORED1, IORED2, IORED4, IORED8, IORED16 corresponding to fuse circuits 1006, 1007, 1008, 1009, and 1010, respectively. The redundancy selection signal YPR is output from fuse circuits 1011 to a redundancy position decoder 130.

FIG. 11 illustrates the relationship among the position of a defective cell array that is to be replaced, the corresponding redundancy position signals IORED, and the redundancy selection signal YPR.

Figure 12:
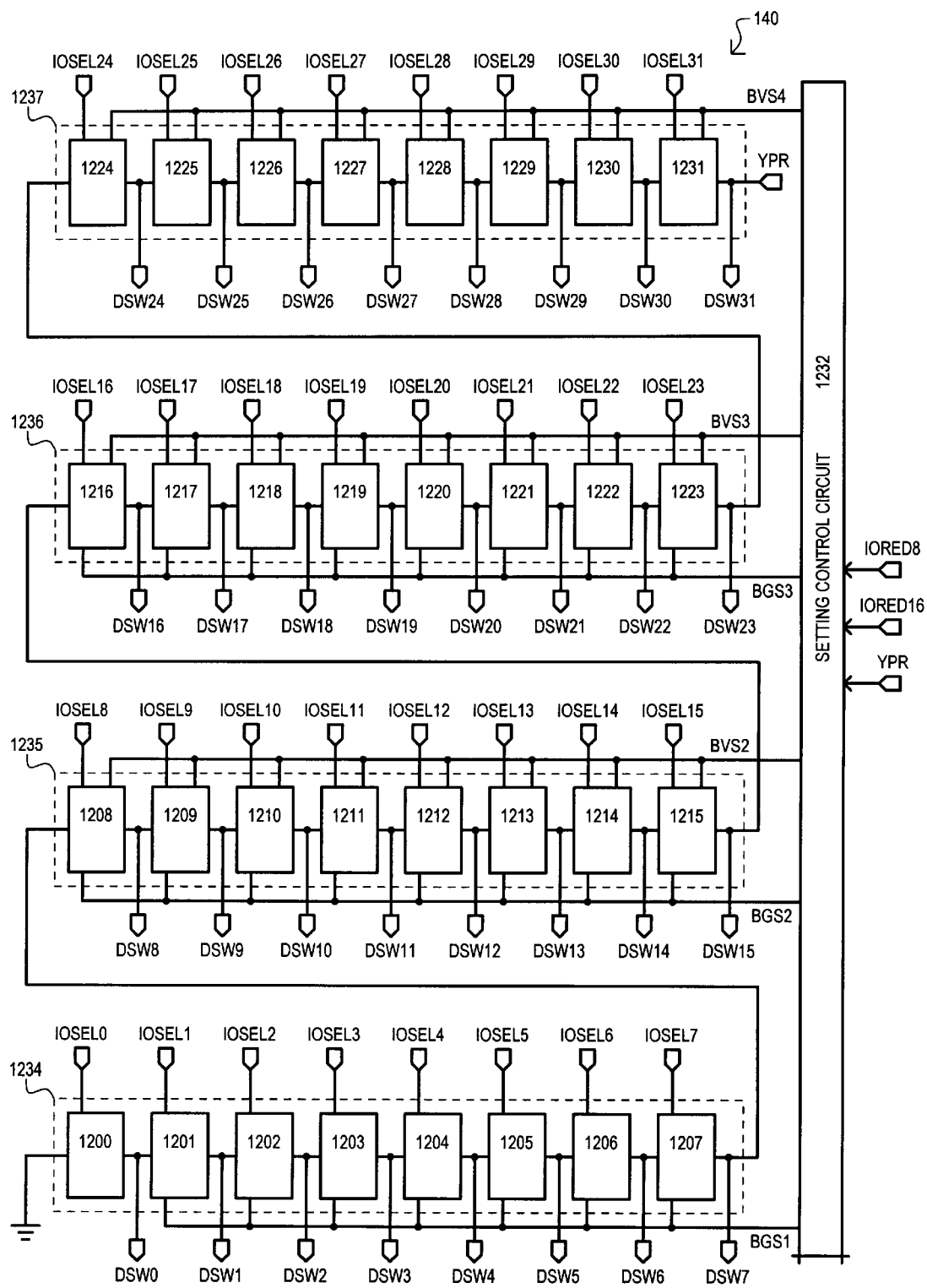
FIG. 12 is a block diagram showing a configuration of an R/N switchover setting circuit according to the third embodiment.

FIG. 12 is a block diagram showing the R/N switchover setting circuit (such as 140) according to the third embodiment of the present invention. The R/N switchover setting circuit 140 of this embodiment includes thirty-two setting circuits 1200–1231 and a setting control circuit 1232. In this case, the thirty-two setting circuits (1200–1231) are divided into four setting blocks 1234 to 1237, so that the bit line switching signals (DSW0 to DSW31) can be set on a setting block basis. For example, the setting block 1234 can set the bit line switching signals DSW0 to DSW7, setting block 1235 can set the bit line switching signals DSW8 to DSW15, setting block 1236 can set the bit line switching signals DSW16 to DSW23, and setting block 1237 can set the bit line switching signals DSW24 to DSW31.

The R/N switchover setting circuit 140 of FIG. 12 receives the thirty-two defective position signals IOSLE0 to IOSEL31 from the redundancy position decoder 130 and the redundancy selection signal YPR from the redundancy determination circuit 120, and outputs the four eight-bit groups of bit line switching signals DSW0 to DSW7, DSW8 to DSW15, DSW16 to DSW23, and DSW24 to DSW31.

The R/N switchover setting circuit 140 converts defective position signals IOSEL0–IOSEL31, in which only bits corresponding to a defective cell array are "1," into bit line switching signals DSW0–DSW31 in which all the bits more significant than the defective cell array bits are set to "1."

Figure 14:
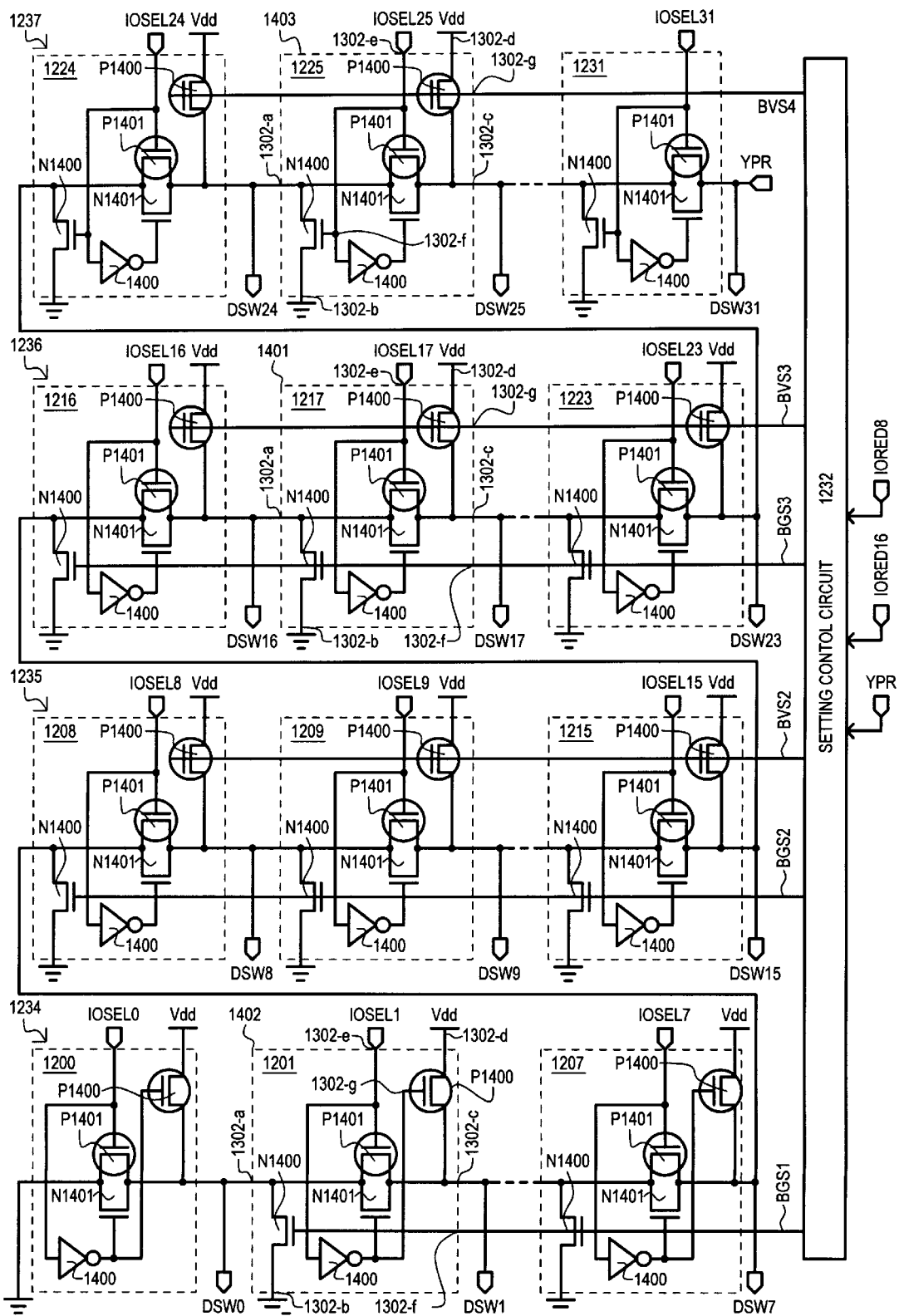
FIG. 14 is a circuit diagram of the setting circuits according to the third embodiment.

FIG. 13 is a conceptual diagram of a setting circuit 1300, such as those set forth as items 1200–1231 in FIG. 12. FIG. 14 sets forth circuit diagram examples for the setting circuits (1200–1231) of the setting blocks (1234–1237) of FIG. 12. As shown in FIG. 13, each of the setting circuits 1300 has three switches 1301-n1 to 1301-n3 (where n=0 to 31). In addition, each setting circuit 1300 includes seven terminals 1302-a, -b, -c, -d, -e, -f and -g.

In FIGS. 13 and 14, the terminal 1302-a is connected to the terminal 1302-c of an adjacent setting circuit, and the terminal 1302-a of the setting circuit 1200 is connected to the ground. The terminal 1302-c is connected to the terminal 1302-a of an adjacent setting circuit, and the terminal 1302-c of the setting circuit 1231 is connected to the redundancy determination circuit 120 so that the terminal 1302-c receives the redundancy selection signal YPR.

The terminals 1302-b and 1302-d of each of the setting circuit 1200 to 1231 are connected to the ground and a power supply, respectively, and so receive the logic levels "0" and "1," respectively. Further, the terminal 1302-e is connected to the redundancy position decoder 130 to receive a defective position signal (IOSEL0–IOSEL31).

Still further, the terminals 1302-c of the setting circuits 1200 to 1231 are connected to the R/N switching circuit 150 so that the terminals 1302-c output their logic levels to the R/N switching circuit 150 as the bit line switching signals DSW0 to DSW31.

Each of the setting circuits 1200 to 1231 has, as described above, the three switches 1301-n1 to 1301-n3. Each of the switches 1301-n1, 1301-n2 and 1301-n3 turns on and off according to the signal levels inputted to the terminals 1302-f, 1302-e and 1302-g, respectively. For example, when the terminal 1302-e of a setting circuit 1300 is "0," the switch 1301-n2 turns on to set the terminals 1302-a and 1302-c to the same logic level. When the terminal 1302-e is "1," the switch 1301-n2 turns off allowing the terminals 1302-a and 1302-c to be set to different logic levels.

Further, when the terminal 1302-f is "1," the switch 1301-n1 turns on to set the terminals 1302-a and 1302-b to the same logic level, whereas when the terminal 1302-f is "0," the switch 1301-n1 turns off. Since the terminal 1302-b is connected to the ground in this embodiment, the terminal 1302-a is set to "0" when the switch 1301-n1 turns on.

Still further, when the terminal 1302-g is "0," the switch 1301-n3 turns on to set the terminals 1302-c and 1302-d to the same logic level, whereas when the terminal 1302-g is "1," the switch 1301-n3 turns off. Since the terminal 1302-d is connected to the power supply in this embodiment, the terminal 1302-c is set to "1" when the switch 1301-n3 turns on.

Since the terminal 1302-a of the setting circuit 1200 (located at the "lowest" position) is connected to the ground, the switch 1301-01 within such setting circuit may be omitted. A detailed configuration of the setting circuit 1200 is the same as that shown in FIG. 9.

Further, since the terminal 1302-c of the setting circuit 1231 (located at the "highest" position) is supplied with a redundancy selection signal YPR, the switch 1301-313 within such setting circuit may be omitted. A detailed configuration of the setting circuit 1231 is the same as that shown in FIG. 9.

Still further, referring to FIG. 14, the terminal 1302-g of each of the setting circuits 1201 to 1207 is connected to the terminal 1302-e through an inverter 1400 and is controlled to turn on and off by an inverted signal at the terminal 1302-e. The terminal 1302-f of each of the setting circuits 1224 to 1231 is connected to the terminal 1302-e, and is controlled to turn on and off by the same signal as that which is applied to terminal 1302-e.

FIGS. 14 provides detailed circuit diagrams showing the setting circuits 1208 to 1223, the setting circuits 1201 to 1207, and the setting circuits 1224 to 1230. These circuits are composed of components similar to those of the circuit shown in FIG. 9. To that extent, similar portions will not be described.

Three particular setting circuit arrangements are identified in FIG. 14 as items 1401, 1402, and 1403. Setting circuit 1401 (also shown as 1217) can be employed as setting circuits 1208–1223. Setting circuit 1402 (also shown as 1201) can be employed as setting circuits 1201–1207. Setting circuits 1403 (also shown as 1225) can be employed as setting circuits 1224–1230.

The setting circuit 1401 includes a p-type transistor P1400 and an n-type transistor N1400 controlled by signals applied at terminals 1302-g and 1302-f, respectively. The transistors P1400 and N1400 are thus controlled by signals applied that are different from the signal applied at terminal 1302-e.

The setting circuit 1402 is shown in FIG. 14 to have an n-type transistor N1400 having a gate that is connected to the terminal 1302-f, and thus is turned on and off by a signal that is different from a signal applied at the terminal 1302-e. The setting circuit 1402 also includes a p-type transistor P1400 having a gate that is connected to the terminal 1302-e through the inverter 1400. Thus, transistor P1400 is turned on and off by the signal applied at the terminal 1302-e.

The setting circuit 1403 is shown in FIG. 14 to include a p-type transistor P1400 having a gate that is connected to the terminal 1302-g, and thus is turned on and off by a signal different from that applied at the terminal 1302-e. Setting circuit 1403 also includes an n-type transistor N1400 having a gate that is connected to the terminal 1302-e, and thus is turned on and off by the same signal that is applied at the terminal 1302-e.

FIG. 15a is a circuit diagram of a setting control circuit such as 1232. FIG. 15b shows a truth table for such a circuit.

The setting control circuit 1232 is designed to output control signals for setting the logic level of either the terminal 1302-a or 1302-c collectively on a setting block (1234 to 1237) basis. The setting control circuit 1232 generates the control signals by decoding the redundancy position signals IORED8 and IORED16, and outputs the obtained control signals in the form of "V-setting" signals BVS2 to BVS4 and "G-setting" signals BGS1 to BGS3.

As shown in FIG. 15a, the setting control circuit 1232 can include inverters 1501 and 1502, and NAND gates 1503–1506.

The NAND gate 1503 receives signals obtained by inverting the redundancy position signals IORED8 and IORED16 using the corresponding inverters 1501 and 1502 as one input, and the redundancy selection signal YPR as another input. In response to the inputs, the NAND gate 1503 generates the logical NAND of these signals, and thereby provide the V-setting signal BVS2 and the G-setting signal BGS1.

The NAND gate 1504 receives the output of inverter 1501 as one input, and the redundancy selection signal YPR as another input, and generates the logical NAND of these inputs as the V-setting signal BVS3 and the G-setting signal BGS2.

The NAND gate 1505 receives the output of NAND gate 1506 as one input and the redundancy selection signal YPR as another input. NAND gate 1506 receives the redundancy position signals IORED8 and IORED16 as inputs. NAND gate 1505 thus generates the V-setting signal BVS4 and the G-setting signal BGS3.

One skilled in the art would recognize that the decoder of FIG. 15a relies on conflicting logic signals resulting in a logic low value. It is understood that NAND gate 1503 could be a three input NAND gate that receives the YPR signal as one input and the indicated nodes as the other inputs.

FIG. 15b shows the truth table that indicates a relation between the redundancy position signals IORED8 and IORED16, the V-setting signals BVS2 to BVS4 and the G-setting signals BGS1 to BGS3.

The V-setting signals BVS2 to BVS4 are connected to the terminals 1302-g of the setting blocks 1235 to 1237 to collectively set the terminals 1302-c within the corresponding setting circuits to "1". For example when there is a defective cell array coupled to any of the bit lines BL8 to BL15 (which correspond to the setting block 1235), a "1" is always set at the terminals 1302-c of the higher setting blocks 1236 and 1237. Therefore, the switches 1301-n3 are turned on by setting both the V-setting signals BVS3 and BVS4 to "0," so that the terminals 1302-c of the setting circuits 1216 to 1231 are connected to their terminals 1302-d, thereby setting the terminals 1302-c to "1." With this operation, the bit line switching signals DSW16 to DSW30 can be collectively set to "1" at a high speed without having to set these signals one-by-one from the redundancy selection signal YPR terminal that is located at the highest position (i.e., coupled to setting circuit 1231).

The G-setting signals BGS1 to BGS3 are connected to the terminals 1302-f of the setting blocks 1234 to 1236 to collectively set the terminals 1302-a to "0," respectively. For example, when there is a defective cell array coupled to any of the bit lines BL16 to BL23 (which correspond to the setting block 1236), a "0" is always set at the terminals 1302-a of the lower setting blocks 1234 and 1235. Therefore, the switches 1301-n1 are turned on by setting both the G-setting signals BGS1 and BGS2 to "1," so that the terminals 1302-a of the setting circuits 1201 to 1215 are connected to their terminals 1302-b. Because the terminals 1302-b are set to "0," the terminals 1302-a are set to "0." With this operation, the bit line switching signals DSW0 to DSW15 can be collectively set to "0" at a high speed without having to set these signals one by one from the setting circuit 1200 that is located at the lowest position.

Next, an operation of the R/N switchover setting circuit 140 will be described in conjunction with FIGS. 12 to 15b.

The following describes a case where no replacement with a redundancy cell array is required. In such a case, the redundancy selection signal YPR is "0" and all the defective position signals IOSLE0 to IOSEL31 are "1."

With YPR and the IOSLE0 to IOSEL31 signals at "0," as shown in FIG. 15b, the V-setting signals BVS2 to BVS4 and the G-setting signals BGS1 to BGS3 are "1." Therefore, the terminals 1302-a of the setting blocks 1234 to 1237 are collectively set to "0," which in turn sets all the bit line switching signals DSW0 to DSW23 to "0."

Further, since all the defective position signals IOSEL24 to IOSEL31 of the setting circuits 1224 to 1231 of the setting block 1237 are "0," the terminals 1302-a of these setting circuits (1224 to 1231) are coupled to their corresponding terminals 1302-c. Further, the terminal 1302-c of the setting circuit 1223 is set to "0," and this is propagated not only to the terminal 1302-a of the setting circuit 1224, but also to the setting circuits 1225, 1226 and so on, from one to another. Furthermore, the redundancy selection signal YPR is also set to "0," and this is likewise propagated not only to the terminal 1302-a of the setting circuit 1231, but also to the setting circuits 1230, 1229 and so on, from one to another. Hence, "0" is set at all the terminals 1302-a and 1302-c of the setting circuits 1224 to 1231 in the end, which in turn sets all the bit line switching signals DSW24 to DSW31 to "0."

Next, the following describes a case where defective cells are present in a normal cell array connected to the bit line BL3, and the normal cell array is replaced by utilizing a redundancy cell array. In such a case, the YPR signal "1" and the defective position signal IOSEL3 is "1." The other defective position signals IOSEL0-2 and IOSEL4-IOSEL31 are "0."

In this case, all the V-setting signals BVS2 to BVS4 are set to "0" and all the G-setting signals BGS1 to BGS3 to "0" as shown in FIG. 15b. Therefore, the terminals 302-c of the setting blocks 1235 to 1237 are collectively set to "1," which in turn, sets all the bit line switching signals DSW8 to DSW31 to "1."

Further, since the defective position signals IOSLE0 to IOSEL7 are "00010000," an IOSEL3 signal having a "1" value will be applied to setting circuit 1203. This results in terminal 302-a of the setting circuit 1203 being disconnected from its corresponding terminal 1302-c. Within the remaining setting circuits (1200–1202 and 1204–1207) the terminal 1302-a is coupled to its corresponding terminal 1302-c. Further, since the terminal 1302-a of the setting circuit 1200 is "0," this logic level is propagated not only to the terminal 1302-c of the setting circuit 1200, but also to the setting circuits 1201, 1202 and so on, from one to another. Furthermore, the terminal 1302-c of the setting circuit 1208 is set to "1," and this logic level is propagated not only to the terminal 1302-a of the setting circuit 1208, but also to the setting circuits 1207, 1206 and so on, from one to another. As a result, the terminals 1302-c of the setting circuits 1200 to 1202 are set to "0," and terminals 1302-c of the setting circuits 1203 to 1207 are set to "1." Hence, the bit line switching signals DSW0 to DSW7 are set to "00011111," respectively.

Next, the following will describe a case where defective cells are present in the normal cell array connected to the bit line BL9 and these cells are replaced by using a redundancy cell array. In such a case, the redundancy selection signal YPR is "1" and the defective position signal IOSEL9 is "1."

The remaining defective position signals IOSEL0–IOSEL8 and IOSEL10–IOSEL31 are "0."

In this case, the V-setting signals BVS4 to BVS2 are set to "001" and the G-setting signals BGS3 and BGS1 are set to "001," as shown in FIG. 15b. Therefore, the terminals 1302-c of the setting blocks 1236 and 1237 are collectively set to "1." This, in turn, sets all the bit line switching signals DSW16 to DSW31 to "1." Further, the terminals 1302-a of the setting circuits 1201 to 1207 within the setting block 1234 are collectively set to "0." Since the terminal 1302-a of the setting circuit 1207 is in conduction with its terminal 1302-c, the terminal 1302-c of the setting circuit S7 is also set to "0." As a result, all the bit line switching signals DSW0 to DSW7 are set to "0."

Since the defective position signals IOSEL8 to IOSEL15 are "01000000," an IOSEL9 signal having a "1" value will be applied to setting circuit 1209. This results in the terminal 1302-a of the setting circuit 1209 being disconnected from its terminal 1302-c. Further, since the terminal 1302-a of the setting circuit 1207 is "0," this logic level is propagated not only to the terminal 1302-c of the setting circuit 1207, but also to the setting circuit 1208. Further, since the terminal 1302-c of the setting circuit 1216 is set to "1," this logic level is propagated not only to the terminal 1302-a of the setting circuit 1216, but also to the setting circuits 1215, 1214 and so on, from one to another. Consequently, the terminal 1302-c of the setting circuit 1208 is set to "0", and the terminals 1302-c of the setting circuits 1209 to 1215 are set to "1." Hence, the bit line switching signals DSW8 to DSW15 are set to "01111111."

Next, a case where defective cells are present in a normal cell array that is connected to a bit line BL29 will be described. The cells of the defective normal cell array are replaced by utilizing a redundancy cell array, thus the redundancy selection signal YPR is "1." In addition, the defective position signal IOSEL29 is "1 " while the other defective position signals IOSEL0–IOSEL28 and IOSEL30–1OSEL31 are "0."

As shown in FIG. 15b, in this case the V-setting signals BVS2 to BVS4 are set to "111" and the G-setting signals BGS1 to BGS3 are set to "111." Therefore, the terminals 1302-a of the setting blocks 1234 to 1236 are collectively set to "0." This sets all the bit line switching signals DSW0 to DSW23 to "0."

In addition, because of the location of the normal cell array that is to be replaced, the defective position signals IOSEL24 to IOSEL31 are "00000100." Due to the IOSEL24 to IOSEL31 signals, the terminal 1302-a of the setting circuit 1229 is disconnected from its terminal 1302-c. Further, since the terminal 1302-a of the setting circuit 1223 is "0," this logic level is propagated not only to the terminal 1302-c of the setting circuit 1223, but also to the setting circuits 1224, 1225 and so on, from one to another. Further, since the redundancy selection signal YPR is "1," this logic level is propagated to the setting circuits 1231, 1230 and so on, from one to another. Consequently, the terminals 1302-c of the setting circuits 1224 to 1228 are set to "0," and the terminals 1302-c of the setting circuits 1229 to 1231 are set to "1." Hence, the bit line switching signals DSW24 to DSW31 are set to "00000111."

As described above, the setting circuits 1200 to 1231 of the R/N switchover setting circuit 140 are divided into the four setting blocks (1234–1237), and the position of a setting block where there is a defective cell array is specified on the basis of the redundancy position signals IORED8 and IORED16. Then, the setting blocks higher than the specified setting block are collectively set to "1" and the setting blocks lower than the specified setting block are collectively set to "0." As a result, even if the number of input/output lines I/O is increased, the bit line switching signals DSW0–DSW31 can be set at a high speed.

While the example in which a G-setting signal BGS4 is not supplied to the setting block 1237 has been described in this embodiment, it may be modified such that a G-setting signal BGS4 is generated and supplied to the terminals 1302-f of the setting circuits 1224 to 1231. In such an arrangement, the setting signal BGS4 is not generated based on the redundancy position signals IORED8 and IORED16, but may be generated in such a manner that the setting signal BGS4 is set to "1" when the redundancy selection signal YPR is "0" and set to "0" when the signal YPR is "1." That is, the setting block 1237 outputs the bit line switching signals DSW24 to DSW31 that are "0" only when the redundancy cell array is not used, and there is no such case where all the signals DSW24 to DSW31 are set to "0" otherwise.

Further, while the example in which a V-setting signal BVS1 is not supplied to the setting block 1234 has been described in this embodiment, it may be modified such that a V-setting signal BVS1 is generated and supplied to the terminals 1302-g of the setting circuits 1201 to 1207. In such an arrangement, the setting signal BVS1 is not generated on the basis of the redundancy position signals IORED8 and IORED16, but may be generated in such a manner that the setting signal BVS1 is set to "0" when the defective position signal IOSEL0 is "1" and that the signal BVS1 is set to "1" when the signal IOSLE0 is "0." That is, the setting block 1234 outputs the bit line switching signals DSW0 to DSW7 that are "1" only when there is a defective cell array in the lowest bit line, and there is no such case where all the signals DSW0 to DSW7 are set to "1" otherwise.

Figure 16:
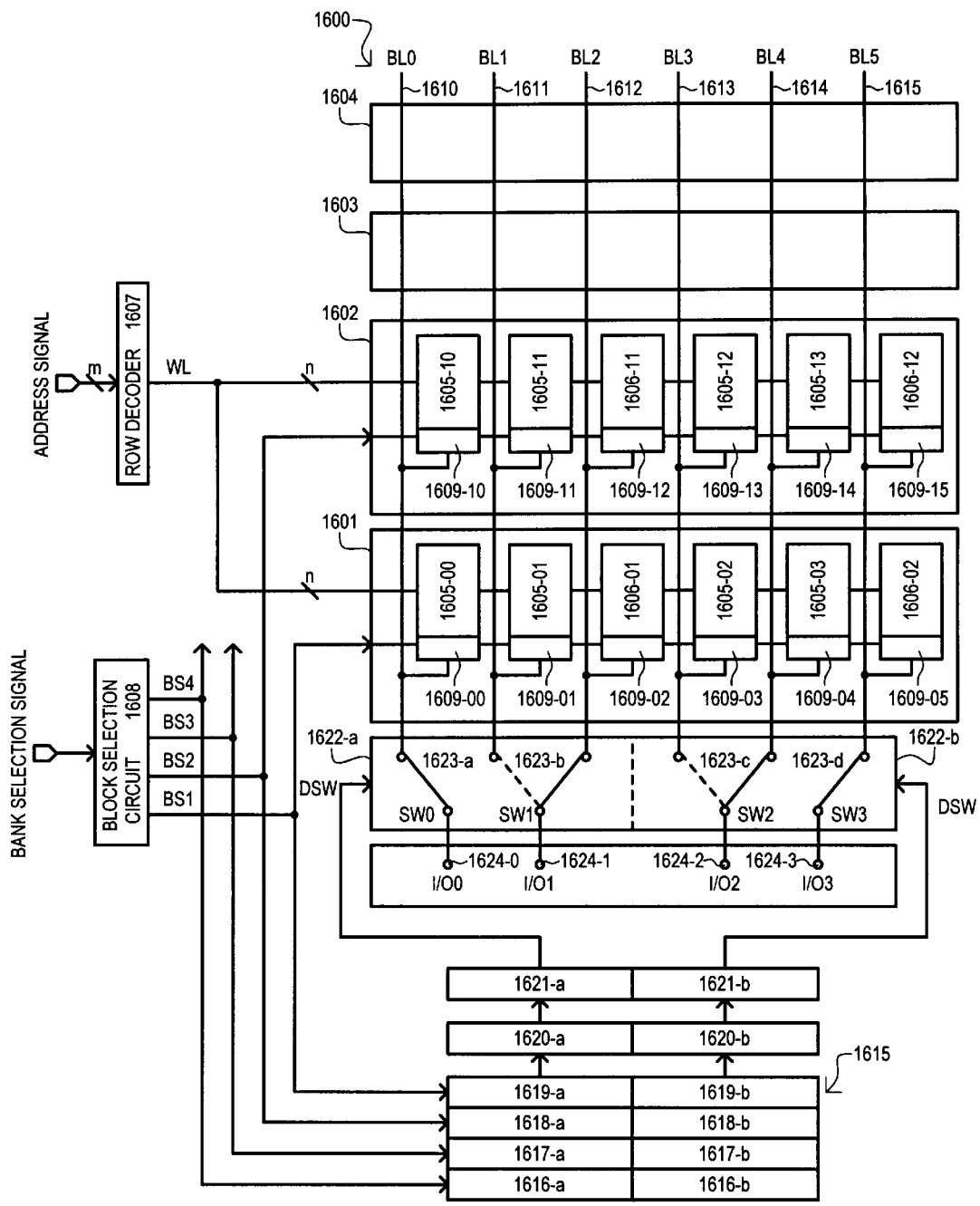
FIG. 16 is a block diagram showing a configuration of a main portion of a semiconductor memory device according to a fourth embodiment.
Figure 17:
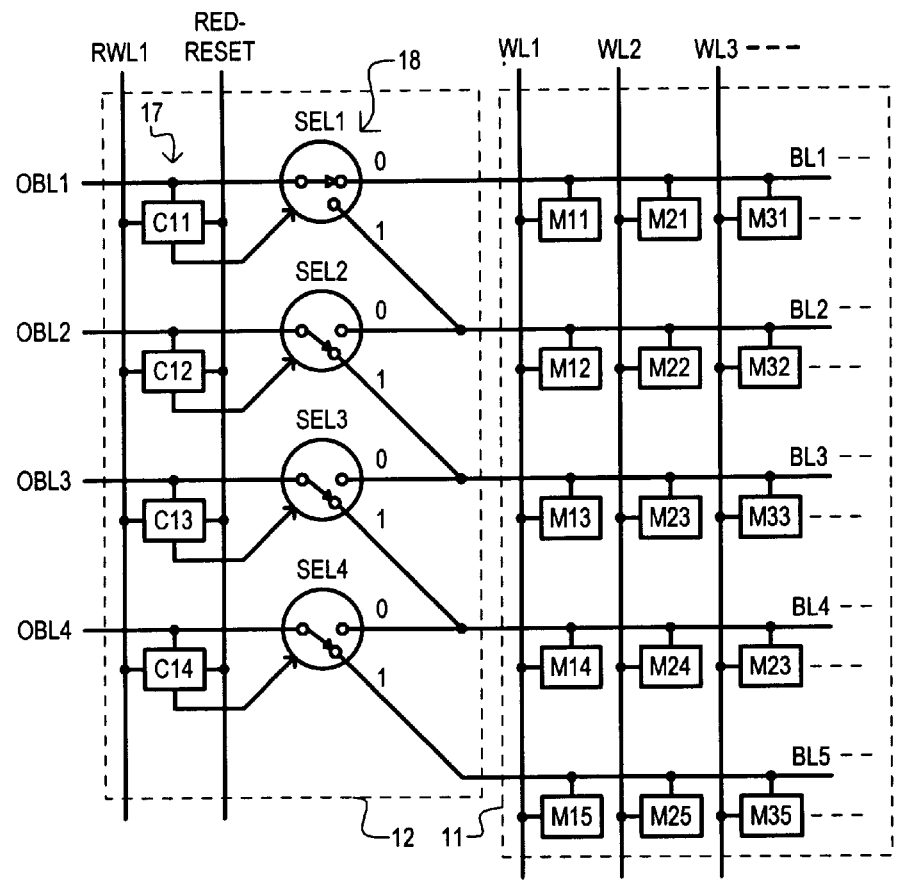
FIG. 17 is a diagram explaining an operation of a main portion of a first conventional device.
Figure 18:
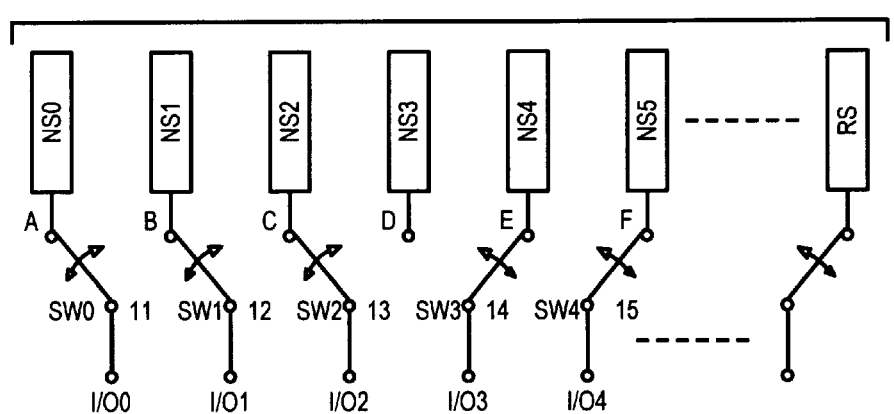
FIG. 18 is a block diagram showing a configuration of a main portion of a second conventional device.

FIG. 16 is a block diagram showing a configuration of a main portion of a semiconductor memory device according to a fourth embodiment of the present invention. The fourth embodiment sets forth an arrangement in which two redundancy cell arrays are provided in a single memory block and a memory block is selected using a bank switching signal.

In FIG. 16, a memory cell array 1600 includes four memory blocks 1601 to 1604. The memory block 1601 has four normal cell arrays 1605-00 to 1605-03 and two redundancy cell arrays 1606-01 and 1606-02, and the memory block 1602 has four normal cell arrays 1605-10 to 1605-13 and two redundancy cell arrays 1606-11 and 1606-12.

A row decoder 1607 decodes an address received from an outside device and activates one of a plurality of word lines WL, in a similar fashion to the first embodiment. However, the plurality of word lines WL are connected commonly to the memory blocks (1601–1604), unlike the first embodiment.

A block selection circuit 1608 receives a signal, such as a bank selection signal, from an outside device. In response to received signals, the block selection signal 1608 outputs block selection signals BS1 to BS4. The block selection signals BS1 to BS4 are such that in a given access, one of the outputted signals is "1" while the rest are "0."

Selection transistors 1609-00 to 1609-05 and 1609-10 to 1609-15 are provided between the cell arrays (1605-00 to 1606-12) and bit lines BL0–BL5 (also shown as 1610–1615), respectively. The block selection signals BS1 to BS4 select one of the memory blocks (1601–1604), controlling the connection of the cell arrays (1605-00 to 1605-13) with the bit lines BL0–BL5. A memory cell within a memory block (1601–1604) can be selected by a block selection signal (BS1–BS4) that is "1," and a word line WL that is "1." In this way data can be output from the selected memory cell.

A redundancy determination circuit 1615 has fuse blocks 1616-a to 1619-a and 1616-b to 1619-b. Stored within each fuse blocks (1616-a to 1619-b) is information indicating whether or not the redundancy cell arrays are used per memory block, and the information about the position of defective cells that are to be replaced. This is similar to the first embodiment. Unlike the first embodiment, however, the circuit 1615 selects a fuse block (1616-a to 1619-b), not with a signal obtained by decoding an address signal, but with a bank switching signal supplied from an outside device. That is, the output of the above block selection circuit 1608 is used not only to select the memory blocks (1601–1604) but also to select the fuse blocks (1616-a to 1619-b).

Further, each memory block (1601–1604) can be conceptualized as having two arrays groups, each group including two normal cell arrays (1605-00/1605-01, 1605-02/1605-03, 1605-10/1605-11, 1605-12/1605-13) and one redundancy cell array (1606-01 to 1606-12). The fuse blocks (1616-a to 1619-b) can be conceptualized as being arranged into groups of two, with fuse blocks 1616-a to 1619-a being one fuse block of each group, and fuse blocks 1616-b to 1619-b being the other fuse block of each group.

The redundancy determination circuit 1615 selects one of the plurality of fuse blocks (1616-a to 1619-b) based on the block selection signals BS1 to BS4, and outputs the redundancy position signals (IORED) in a similar fashion to the first embodiment. Unlike the first embodiment, however, the redundancy determination circuit 1615 selects a pair of fuse blocks (1616-a/1616-b, 1617-a/1617-b, 1618-a/1618-b or 1619-a/1619-b) when any one of the fuse block selection signals BS1 to BS4 is set to "1." The selected pair of fuse blocks will provide two pairs of redundancy position signal IOREDs.

Also set forth in FIG. 16 are redundancy position decoders 1620-a and 1620-b, which decode two pairs of redundancy position signals IORED, and output two pairs of defective position signals IOSEL. The two pairs of defective position signals IOSEL are applied to R/N switchover setting circuits 1621-a and 1621-b. The configuration of each of the R/N switchover setting circuits 1621-a and 1621-b is the same as that of the R/N switchover setting circuit 140 in each of the first through third embodiments.

R/N switchover setting circuits 1621-a and 1621-b receives the two pairs of defective position signals IOSEL, and generates therefrom, a pair of bit line switching signals DSW. The DSW signals are applied to R/N switching circuits 1622-a and 1622-b. The R/N switching circuits 1622-a and 1622-b control the switching directions of the switches SW0 to SW3 (1623-0 to 1623-3) on the basis of the bit line switching signals DSW, and connects the cell arrays to the corresponding input/output lines I/O0 to I/O3 (also shown as 1624-0 to 1624-3), to exclude a defective cell array.

As described above, the R/N switchover setting circuits shown in the first to third embodiments can also be applied to a semiconductor memory device having a plurality of redundancy cell arrays in a single memory block, thus contributing to further improving the repair rate. It is noted that the use of a bank switching signal or the like, as a block selection signal, allows the selection signals for memory blocks and the fuse blocks to be shared. In addition, such an approach can reduce the number of address signal lines that are required to provide the redundancy capabilities illustrated. As a result, the number of decoding steps to be taken by the row decoder is reduced, which then contributes to reducing the circuit size significantly.

As described in the foregoing, the present invention provides a semiconductor memory device having normal cell arrays and redundancy cell arrays. Such a device includes defective position setting means, defective array position storing means and defective position transmitting means. The defective position setting means has a plurality of setting circuits. These setting circuits, which are normally set to the conducting state, are connected in series with one another, and one end of each setting circuit is connected to a first logic level and the other end to a second logic level. The defective array position storing means stores the position of a defective normal cell array. The defective position transmitting means provides the information of the defective array position storing means to the defective position setting means. In a semiconductor memory device constructed in this fashion, one of the setting circuits is controlled to be disconnected based on the output of the defective position transmitting. The disconnected setting circuit will then switch from the defective normal array to a redundancy cell array. Therefore, when a normal cell array is defective, and is to be switched with a redundancy cell array, switching can be effected at a high speed without increasing the circuit size, even if the number of I/O lines is increased.

Further, it is noted that in the disclosed embodiments, that the position of a defective array can be stored on the basis of a plurality of row blocks. In addition, the I/O switching means, that switches between a normal cell array and a redundancy cell array, can be used in common for a plurality of row blocks. In this way, a device employing such redundancy can be reduced in size.

It is understood that while the various particular embodiments set forth herein have been described in detail, the present invention could be subject to various changes, substitutions, and alterations without departing from the spirit and scope of the invention. Accordingly, the present invention is intended to be limited only as defined by the appended claims.

What is claimed is:

1. A semiconductor memory device, comprising:

a plurality of normal cell arrays, each including a plurality of memory cells;

at least one redundancy cell array that includes a plurality of memory cells;

a plurality of memory blocks, each including a plurality of normal cell arrays and at least one redundancy cell array;

a redundancy determination circuit for storing redundancy selection information and defective position information, the redundancy selection information indicating if a normal cell array within a memory block is to be replaced by a redundancy cell array, the defective position information indicating a position of a normal cell array that is to be bypassed by using a redundancy cell array;

a switchover setting circuit having a plurality of setting circuits, each setting circuit having a first switching circuit disposed between a first terminal and an associated second terminal, the first terminal of selected setting circuits being coupled to the second terminal of an adjacent setting circuit, at least one of the first terminals being a lowest terminal that is coupled to a second logic level, and at least one of the second terminals being a highest terminal that is coupled to a redundancy selection information output terminal, the first switching circuit forming a conducting path or a non-conducting path between their first terminals and their associated second terminals in response to defective position information, the second terminals of the setting circuits providing switching signals; and a switching circuit for selecting one of at least two bit lines according to the switching signals output from the of the switchover setting circuit and connecting the selected bit line to an input/output section.

2. The semiconductor memory device according to claim 1, wherein:

selected of the setting circuits include
a third terminal for receiving a signal based on the redundancy position information, and
a second switching circuit disposed between a first logic level and the second terminal of the setting circuit, each second switching circuit having a control terminal coupled to the third terminal and being set to a non-conducting state when that first switching circuit is in the conducting state, and being set to the conducting state when the first switching circuit is in the non-conducting state.

3. The semiconductor memory device according to claim 1, wherein:

selected of the setting circuits includes
a third terminal for receiving a signal based on the redundancy position information; and
a third switching circuit disposed between a second logic level and the first terminal of the setting circuit, each third switching circuit having a control terminal coupled to the third terminal and being set to a non-conducting state when the first switching circuit is in the conducting state, and being set to the conducting state when the first switching circuit is in the non-conducting state.

4. The semiconductor memory device according to claim 1, wherein:

selected of the setting circuits include
a third terminal for receiving a signal based on the redundancy position information,
a second switching circuit disposed between a first logic level and the second terminal of the setting circuit, each second switching circuit having a control terminal coupled to the third terminal and being set to a non-conducting state when first switching circuit is in the conducting state, and being set to the conducting state when the first switching circuit is in the non-conducting state, and
third switching circuit disposed between a second logic level and the first terminal of the setting circuit, each third switching means having a control terminal coupled to the third terminal and being set to a non-conducting state when the first switching means is in the conducting state, and being set to the conducting state when the first switching circuit is in the non-conducting state.

5. The semiconductor memory device according to claim 1, wherein:

the switchover setting circuit includes
a setting control circuit for outputting a first-type setting signal having a first logic value based on the redundancy position information, and
the setting circuits being divided into a plurality of blocks, selected setting circuits including
a third terminal for receiving a defective position signal generated based on the redundancy position information,
a fourth terminal for receiving the first-type setting signal, and
a second switching circuit disposed between the first logic level and the second terminal, the second switching circuit including a control terminal coupled to the fourth terminal.

6. The semiconductor memory device according to claim 1, wherein:

the switchover setting circuit includes
a setting control circuit for outputting a second-type setting signal having a second logic value based on the redundancy position information, and
the setting circuits being divided into a plurality of blocks, selected setting circuits including
a third terminal for receiving a defective position signal generated based on the redundancy position information,
a fifth terminal for receiving the second-type setting signal, and
third switching circuit disposed between the second logic level and the first terminal, the third switching circuit including a control terminal coupled to the fifth terminal.

7. The semiconductor memory device according to claim 1, wherein:

the switchover setting circuit includes
a setting control circuit for outputting a first-type setting signal and a second-type setting signal having logic levels based on the redundancy position information, and
the setting circuits being divided into a plurality of blocks, selected setting circuits including
a third terminal for receiving a defective position signal generated based on the redundancy position information,
a fourth terminal for receiving the first-type setting signal,
a fifth terminal for receiving the second-type setting signal,
second switching circuit disposed between the first logic level and the second terminal, the second switching circuit including a control terminal coupled to the fourth terminal, and
third switching circuit disposed between the second logic level and the first terminal, the third switching circuit including a control terminal coupled to the fifth terminal.

8. The semiconductor memory device according to claim 1, wherein:

the redundancy determination circuit includes
a plurality of fuse blocks, each fuse block storing the defective position information of a normal cell array that is to be replaced with a redundancy cell array by converting the information into a binary code, and
a block selection circuit, the block selection circuit outputting a signal for selecting a fuse block.

9. The semiconductor memory device according to claim 8, wherein:

the block selection circuit includes an address decoder for decoding an address and outputting the signal for selecting a fuse block.

10. The semiconductor memory device according to claim 8, wherein:

the block selection circuit includes a circuit for outputting a signal for selecting a fuse block and a memory block based on a bank selection signal.

11. The semiconductor memory device according to claim 8, wherein:

each fuse block includes a first fuse circuit for storing the redundancy selection information and a plurality of second fuse circuits for storing the defective position information; and each of the second fuse circuits is connected to a first logic level via the first fuse circuit.

12. The semiconductor memory device according to claim 8, wherein:

the fuse block includes first and second fuses for storing the redundancy selection information, and third and fourth fuses for storing the defective position information, each first fuse having a first end coupled to a first logic level, and a second end coupled to a first end of a second fuse, a first end of a third fuse, and a redundancy selection signal output terminal, each second fuse includes a second end coupled to a second logic level, each third fuse includes a second end coupled to a first end of a fourth fuse and a redundancy position signal output terminal, and each fourth fuse includes a second end coupled to the second logic level.

13. The semiconductor memory device according to claim 1, wherein:

the switching circuit is commonly connected to bit lines of the plurality of memory blocks.

14. A semiconductor device, comprising:

a plurality of circuit cells arranged in an array;

a plurality of conductive lines coupled to the circuit cells;

a plurality of input/output (I/O) lines;

a switching circuit that includes a plurality of switching devices, each switching device being associated with one of the I/O lines and at least two of the conductive lines, each switching device coupling its associated I/O line to one of its associated conductive lines according to a corresponding switching signal; and a switchover setting circuit that includes a plurality of signal nodes that provide switching signals, each signal node being coupled to an adjacent signal node by a controllable impedance path, each controllable impedance path receiving position information for a predetermined group of circuit cells, and providing a relatively high impedance path when the position information indicates that the corresponding group of circuit cells are defective.

15. The semiconductor device of claim 14, wherein:

the controllable impedance paths are arranged in series, beginning with a first controllable impedance path that is coupled to a first logic level.

16. The semiconductor device of claim 15, wherein:

the controllable impedance paths include a second controllable impedance path that can be driven to a second logic level.

17. The semiconductor device of claim 14, wherein:

the switchover setting circuit further includes setting devices coupled to selected signal nodes, the setting devices providing controllable impedance paths between their respective signal nodes and predetermined potentials.

18. A semiconductor memory device, comprising:

a plurality of bit lines, each bit line being coupled to at least one memory cell;

a plurality of input/output (I/O) lines;

a switching circuit that receives switching signals and couples one of at least two bit lines to each I/O line; and a switchover setting circuit that includes a plurality of switching nodes, a plurality of setting circuits arranged in series and logically arranged into blocks, each setting circuit being coupled to one of the switching nodes and receiving position information corresponding to at least one bit line, the setting circuits of like blocks further receiving at least one block setting signal, and each setting circuit generating a high impedance path in response to position information of a predetermined value, and coupling its corresponding switching node to a predetermined logic value in response to its corresponding block setting signal being activated.

19. The semiconductor memory device of claim 18, wherein:

selected setting circuits include a first switching device coupled between a first node and a second node, the first switching device being activated according to position information, and a second switching device coupled between the first node and a first logic value, the second switching device being activated according to an active block setting signal.

20. The semiconductor memory device of claim 19, wherein:

selected setting circuits further include a third switching device coupled between the second node and a second logic value, the third switching device being activated according to an active block setting signal.

21. A semiconductor memory device, comprising:

a plurality of word lines divided into a plurality of groups each including at least one word line, a plurality of bit lines each intersecting said plurality of word lines, a plurality of memory cells disposed at intersections of said plurality of word lines and said plurality of bit lines;

a plurality of I/O lines;

a switching circuit including a plurality of switching devices, each of which is associated with one of said I/O lines and at least two of said bit lines;

a plurality of fuse blocks, each fuse block being associated with one of said plurality of groups, each of said fuse blocks being capable of storing a defect address information into a binary form indicative of an address of a bit line corresponding to a defect memory cell, each of said fuse blocks generating said defect address information when an associated group of said plurality of word lines are accessed and said associated group includes a word line coupled to the defect memory cell;

a decoder circuit decoding said defect address information to generate a decoded defect address information of decoded form which is a decoded result of said defect address information; and a switchover setting circuit including a plurality of signal nodes provides switching signals, each signal node being coupled to an adjacent signal node by a transistor, each transistor having a gate electrode receiving an associated bit of said decoded defect address information, each of said switching devices being controlled by an associated one of said switching signals to determine which one of said bit lines and said 1/O line are connected.

* * * * *